(12) United States Patent
Yamamoto

(10) Patent No.: US 11,145,268 B2
(45) Date of Patent: *Oct. 12, 2021

(54) ACTIVE MATRIX SUBSTRATE INCLUDING SETTING THIN FILM TRANSISTOR AND RESETTING THIN FILM TRANSISTOR AND DISPLAY DEVICE INCLUDING SAME

(71) Applicant: Sharp Kabushiki Kaisha, Sakai (JP)

(72) Inventor: Kaoru Yamamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 79 days.

This patent is subject to a terminal disclaimer.

(21) Appl. No.: 16/603,597

(22) PCT Filed: Apr. 5, 2018

(86) PCT No.: PCT/JP2018/014610
§ 371 (c)(1),
(2) Date: Oct. 8, 2019

(87) PCT Pub. No.: WO2018/190245
PCT Pub. Date: Oct. 18, 2018

(65) Prior Publication Data
US 2021/0110781 A1    Apr. 15, 2021

(30) Foreign Application Priority Data
Apr. 10, 2017    (JP) .............................. JP2017-077384

(51) Int. Cl.
*G09G 3/36* (2006.01)
*G02F 1/1362* (2006.01)
(Continued)

(52) U.S. Cl.
CPC ......... *G09G 3/3688* (2013.01); *G02F 1/1368* (2013.01); *G02F 1/134372* (2021.01);
(Continued)

(58) Field of Classification Search
CPC ......... G09G 3/3688; G09G 2310/0202; G09G 2310/0248; G09G 2310/297;
(Continued)

(56) References Cited

U.S. PATENT DOCUMENTS 10,622,437 B2 *  4/2020  Yamamoto ........... G09G 3/3688
10,896,656 B2 *  1/2021  Yamamoto ............ H01L 27/124
(Continued)

FOREIGN PATENT DOCUMENTS

JP   2007-114496 A   5/2007
JP   2010-102266 A   5/2010
(Continued)

*Primary Examiner* — Kwang-Su Yang
(74) *Attorney, Agent, or Firm* — Keating & Bennett, LLP

(57) ABSTRACT

An active matrix substrate according to an embodiment of the present invention includes: a plurality of source bus lines provided on a substrate; a source driver disposed in a peripheral region; signal output lines each connected to a corresponding one of output terminals of the source driver; and a demultiplexer circuit disposed in a peripheral region. The demultiplexer circuit includes unit circuits each configured to distribute a display signal from one signal output line to n source bus lines (n is an integer larger than or equal to 2). Each unit circuit includes n switching TFTs configured to perform individual on/off control of electrical connections of the n branch lines to the n source bus lines. The n branch lines being connected to one signal output lines. The demultiplexer circuit further includes a plurality of boost circuits each configured to boost a voltage applied to a gate electrode of a corresponding one of the n switching TFTs.

17 Claims, 20 Drawing Sheets

(51) Int. Cl.
*G02F 1/1368* (2006.01)
*G02F 1/1343* (2006.01)

(52) U.S. Cl.
CPC .. *G02F 1/136286* (2013.01); *G02F 2201/121* (2013.01); *G02F 2202/104* (2013.01); *G09G 2310/0202* (2013.01); *G09G 2310/0248* (2013.01); *G09G 2310/0297* (2013.01); *G09G 2310/08* (2013.01); *G09G 2330/021* (2013.01)

(58) Field of Classification Search
CPC .......... G09G 2310/08; G09G 2330/021; G02F 1/134372; G02F 1/136286; G02F 1/1368; G02F 2201/121; G02F 2202/104
See application file for complete search history.

(56) References Cited

U.S. PATENT DOCUMENTS

| | | | |
|---|---|---|---|
| 2003/0146911 A1* | 8/2003 | Nakanishi | G09G 3/3688 345/211 |
| 2005/0134541 A1* | 6/2005 | Jang | G09G 3/3688 345/94 |
| 2007/0091050 A1 | 4/2007 | Katayama et al. | |
| 2012/0138922 A1 | 6/2012 | Yamazaki et al. | |
| 2013/0038518 A1 | 2/2013 | Tagawa et al. | |
| 2013/0320334 A1 | 12/2013 | Yamazaki et al. | |
| 2014/0286076 A1 | 9/2014 | Aoki et al. | |
| 2016/0093260 A1* | 3/2016 | Watsuda | G09G 3/3688 345/87 |
| 2016/0293093 A1* | 10/2016 | Seo | G09G 3/20 |
| 2016/0329025 A1* | 11/2016 | Park | G09G 3/3648 |
| 2016/0372068 A1* | 12/2016 | Yamamoto | G11C 19/28 |
| 2020/0211489 A1* | 7/2020 | Yamamoto | G09G 3/3688 |
| 2020/0409193 A1* | 12/2020 | Yamamoto | H01L 27/1225 |

FOREIGN PATENT DOCUMENTS

| | | |
|---|---|---|
| JP | 2012-134475 A | 7/2012 |
| JP | 2014-007399 A | 1/2014 |
| JP | 2014-209727 A | 11/2014 |
| WO | 2011/118079 A1 | 9/2011 |

\* cited by examiner (a)

(b)

(a)

(b)

(a)

(b)

ACTIVE MATRIX SUBSTRATE INCLUDING SETTING THIN FILM TRANSISTOR AND RESETTING THIN FILM TRANSISTOR AND DISPLAY DEVICE INCLUDING SAME

TECHNICAL FIELD

The present invention relates to an active matrix substrate and specifically, to an active matrix substrate including a demultiplexer circuit. Moreover, the present invention also relates to a display device including the active matrix substrate.

BACKGROUND ART

An active matrix substrate used for, for example, a liquid crystal display device includes a display region provided with a plurality of pixels and a region (non-display region or frame region) other than the display region. In the display region, a switching element such as a Thin Film Transistor (hereinafter referred to as a "TFT") is provided for each pixel. Widely used examples of such a switching element include a TFT including an amorphous silicon film as an active layer (hereinafter referred to as an "amorphous silicon TFT") and a TFT including a polycrystalline silicon film as an active layer (hereinafter referred to as a "polycrystalline silicon TFT").

It has been proposed to use, as a material for the active layer of the TFT, an oxide semiconductor in place of amorphous silicon or polycrystalline silicon. Such a TFT is referred to as an "oxide semiconductor TFT". The oxide semiconductor has mobility higher than that of the amorphous silicon. Thus, the oxide semiconductor TFT is configured to operate at a higher speed than the amorphous silicon TFT.

In the non-display region of the active matrix substrate, a peripheral circuit such as a drive circuit may be monolithically (integrally) formed. Monolithically forming the drive circuit realizes narrowing of the non-display region (frame narrowing) and a cost reduction by simplification of a mounting step. For example, in the non-display region, a gate driver circuit is monolithically formed, and a source driver circuit may be mounted by using a Chip on Glass (COG) technology.

It is proposed to monolithically form a demultiplexer (DEMUX) circuit, such as a Source Shared Dividing (SSD) circuit in addition to the gate driver in a device, such as a smartphone, which strongly demands frame narrowing (e.g., PTL 1 and PTL 2). The SSD circuit is a circuit for distributing a video signal from one video signal line connected to a corresponding one of terminals of a source driver to a plurality of source lines. Mounting the SSD circuit enables a further reduction of a region (terminal section and line formation region) which is part of the non-display region and in which a terminal section and lines are disposed. Moreover, the number of outputs from the source driver decreases, which enables a circuit scale to be reduced, and therefore, it is possible to reduce the cost of the driver IC.

Peripheral circuits such as the drive circuit and the SSD circuit include TFTs. In the present specification, a TFT disposed as a switching element in each pixel in the display region is referred to as a "pixel TFT", and TFTs included in peripheral circuits are referred to as "circuit TFTs". Moreover, of the circuit TFTs, a TFT used as a switching element in the DEMUX circuit (SSD circuit) is referred to as a "DEMUX circuit TFT".

CITATION LIST

Patent Literature

PTL 1: International Publication No. WO2011/118079
PTL 2: Japanese Unexamined Patent Application Publication No. 2010-102266

SUMMARY OF INVENTION

Technical Problem

It can be said from the perspective of a fabrication process that in an active matrix substrate which adopts an oxide semiconductor TFT as a pixel TFT, the DEMUX circuit TFT is preferably also an oxide semiconductor TFT adopting the same oxide semiconductor membrane as the pixel TFT.

It is, however, difficult to form a DEMUX circuit by adopting the oxide semiconductor TFT, and therefore, as the DEMUX circuit TFT, a polycrystalline silicon TFT has been adopted. The reason for this is as follows.

The mobility of the oxide semiconductor is lower than that of the polycrystalline silicon by about one digit. Therefore, the current drive force of the oxide semiconductor TFT is less than that of the polycrystalline silicon TFT. Thus, when the oxide semiconductor is adopted to form the DEMUX circuit TFT, the size of the TFT has to be larger (channel width has to be larger) or the drive voltage has to be higher than when the polycrystalline silicon is used. When the size of the TFT is increased, the gate capacitance load increases, and thereby, the drive power of the DEMUX circuit increases. On the other hand, when the drive voltage of the TFT is increased, the drive power of the DEMUX circuit increases.

Note that as described later, also when the polycrystalline silicon TFT is used as the DEMUX circuit TFT, adopting only the PMOS process (i.e., polycrystalline silicon TFT including only the PMOS transistor) may lead to the same problem.

In view of the foregoing, it is an object of the present invention is to reduce drive power of an active matrix substrate including a demultiplexer circuit.

Solution to Problem

An active matrix substrate according to an embodiment of the present invention is an active matrix substrate including a display region having a plurality of pixel regions and a peripheral region located in a periphery of the display region, the active matrix substrate including: a substrate; a plurality of gate bus lines and a plurality of source bus lines on the substrate; a source driver disposed in the peripheral region and including a plurality of output terminals; a plurality of signal output lines each connected to a corresponding one of the plurality of output terminals of the source driver; and a demultiplexer circuit which includes a plurality of unit circuits supported by the substrate and which is disposed in the peripheral region, wherein each of the plurality of unit circuits of the demultiplexer circuit distributes a display signal from one signal output line of the plurality of signal output lines to n source bus lines of the plurality of source bus lines, where n is an integer larger than or equal to 2, each of the plurality of unit circuits includes n branch lines connected to the one signal output line, and n switching TFTs each connected to a corresponding one of the n branch lines, the n switching TFTs being configured to perform individual on/off control of electrical connections of the n branch lines to the n source bus lines, and the demultiplexer circuit further includes a plurality of boost circuits each configured to boost a voltage applied to a gate electrode of a corresponding one of the n switching TFTs.

In an embodiment, each of the plurality of boost circuits includes a set unit configured to pre-charge a first node connected to the gate electrode, a boost unit configured to boost a potential of the first node pre-charged by the set unit, and a reset unit configured to reset the potential of the first node.

In an embodiment, the demultiplexer circuit includes a first drive signal line via which a first drive signal is supplied to the set unit, a second drive signal line via which a second drive signal is supplied to the reset unit, and a third drive signal line via which a third drive signal is supplied to the boost unit.

In an embodiment, the set unit includes a setting TFT which includes a gate electrode connected to the first drive signal line and which is diode-connected, the reset unit includes a resetting TFT which includes a gate electrode connected to the second drive signal line and which is configured to pull down the potential of the first node, and the boost unit includes a boosting capacitive element including a first capacitance electrode connected to the third drive signal line and a second capacitance electrode connected to the first node.

In an embodiment, the setting TFT includes a source electrode and a drain electrode one of which is connected to the first drive signal line and the other of which is connected to the first node, and the resetting TFT includes a source electrode and a drain electrode one of which is connected to the first node and to the other of which a constant potential is given.

In an embodiment, the setting TFT includes a source electrode and a drain electrode one of which is connected to the first drive signal line and the other of which is connected to the first node, and the resetting TFT includes a source electrode and a drain electrode one of which is connected to the first node and the other of which is connected to the first drive signal line.

In an embodiment, the set unit includes a setting TFT which includes a gate electrode connected to the first drive signal line and which is diode-connected, the boost unit includes a boosting TFT including a gate electrode connected to the first node, a source electrode and a drain electrode one of which is connected to the third drive signal line and the other of which is connected to a second node different from the first node, the reset unit includes a first resetting TFT and a second resetting TFT each of which includes a gate electrode connected to the second drive signal line and each of which is configured to pull down the potential of the first node, the first resetting TFT includes a source electrode and a drain electrode one of which is connected to the first node, and the second resetting TFT includes a source electrode and a drain electrode one of which is connected to the second node.

In an embodiment, the setting TFT includes a source electrode and a drain electrode one of which is connected to the first drive signal line and the other of which is connected to the first node, and the other of the source electrode and the drain electrode of the first resetting TFT and the other of the source electrode and the drain electrode of the second resetting TFT receive a constant potential.

In an embodiment, the setting TFT includes a source electrode and a drain electrode one of which is connected to the first drive signal line and the other of which is connected to the first node, and the other of the source electrode and the drain electrode of the first resetting TFT and the other of the source electrode and the drain electrode of the second resetting TFT are connected to the first drive signal line.

In an embodiment, the boost unit further includes a boosting capacitive element including a first capacitance electrode connected to the first node and a second capacitance electrode connected to the second node.

In an embodiment, the n switching TFTs included in each of the plurality of unit circuits include a first switching TFT and a second switching TFT which are brought into an ON state at different timings in one horizontal scan period, the plurality of boost circuits include a first boost circuit connected to the first switching TFT and a second boost circuit connected to the second switching TFT, the first drive signal line for the first boost circuit serves also as the second drive signal line for the second boost circuit, and the first drive signal line for the second boost circuit serves also as the second drive signal line for the first boost circuit.

In an embodiment, each of the set unit and the reset unit includes a plurality of TFTs connected in series to each other.

In an embodiment, the n switching TFTs included in each of the plurality of unit circuits are two switching TFTs, and the plurality of boost circuits each includes two boost circuits each of which is connected to a corresponding one of the two switching TFTs.

In an embodiment, the n switching TFTs included in each of the plurality of unit circuits are two switching TFTs, the two switching TFTs are a first switching TFT and a second switching TFT which are brought into an ON state at different timings in one horizontal scan period, and the plurality of boost circuits include a first boost circuit commonly connected to the first switching TFTs of two unit circuits of the plurality of unit circuits and a second boost circuit commonly connected to the second switching TFTs of the two unit circuits.

In an embodiment, the n switching TFTs included in each of the plurality of unit circuits are two switching TFTs, the two switching TFTs are a first switching TFT and a second switching TFT which are brought into an ON state at different timings in one horizontal scan period, and the plurality of boost circuits include a first boost circuit commonly connected to the first switching TFTs of three or more unit circuits of the plurality of unit circuits and a second boost circuit commonly connected to the second switching TFTs of the three or more unit circuits.

In an embodiment, the n switching TFTs included in each of the plurality of unit circuits are three switching TFTs, each of the plurality of unit circuits include three boost circuits of the plurality of boost circuits, and each of the three boost circuits is connected to a corresponding one of the three switching TFTs.

In an embodiment, the n switching TFTs included in each of the plurality of unit circuits are three switching TFTs, the three switching TFTs are a first switching TFT, a second switching TFT, and a third switching TFT which are brought into an ON state at different timings in one horizontal scan period, and the plurality of boost circuits include a first boost circuit commonly connected to the first switching TFTs of two unit circuits of the plurality of unit circuits, a second boost circuit commonly connected to the second switching TFTs of the two unit circuit, and a third boost circuit commonly connected to the third switching TFTs of the two unit circuits.

In an embodiment, the n switching TFTs included in each of the plurality of unit circuits are three switching TFTs, the three switching TFTs are a first switching TFT, a second switching TFT, and a third switching TFT which are brought into an ON state at different timings in one horizontal scan period, and the plurality of boost circuits include a first boost circuit commonly connected to the first switching TFTs of three or more unit circuits of the plurality of unit circuits, a second boost circuit commonly connected to the second switching TFTs of the three or more unit circuits, and a third boost circuit commonly connected to the third switching TFTs of the three or more unit circuits.

In an embodiment, the demultiplexer circuit includes a plurality of clear circuits each connected to a corresponding one of the plurality of boost circuits and each configured to initialize the corresponding one of the plurality of boost circuits at a prescribed timing.

In an embodiment, each of the plurality of clear circuits includes a clearing TFT including a gate electrode to which a clear signal is supplied, and a source electrode and a drain electrode one of which is connected to the first node and to the other of which a constant potential is given.

In an embodiment, the plurality of boost circuits include two or more boost circuits which are driven at the same timing, and the demultiplexer circuit includes a first drive signal line group via which a drive signal group for driving some boost circuits of the two or more boost circuits is supplied and a second drive signal line group via which a drive signal group for driving some other boost circuits of the two or more boost circuits is supplied, the second drive signal line group being different from the first drive signal line group.

In an embodiment, each of the n switching TFTs includes an oxide semiconductor layer as an active layer.

In an embodiment, the oxide semiconductor layer includes an In—Ga—Zn—O-based semiconductor.

In an embodiment, the In—Ga—Zn—O-based semiconductor includes a crystalline portion.

In an embodiment, each of the n switching TFTs is a PMOS transistor including a polycrystalline silicon semiconductor layer as an active layer.

A display device according to an embodiment of the present invention includes the active matrix substrate having any one of the above-described structures, Advantageous Effects of Invention According to the aspect of the present invention, it is possible to reduce drive power of an active matrix substrate including a demultiplexer circuit.

DESCRIPTION OF EMBODIMENTS

Embodiments of the present invention will be described below with reference to the drawings. Note that the present invention is not limited to the following embodiments.

First Embodiment

Figure 1:
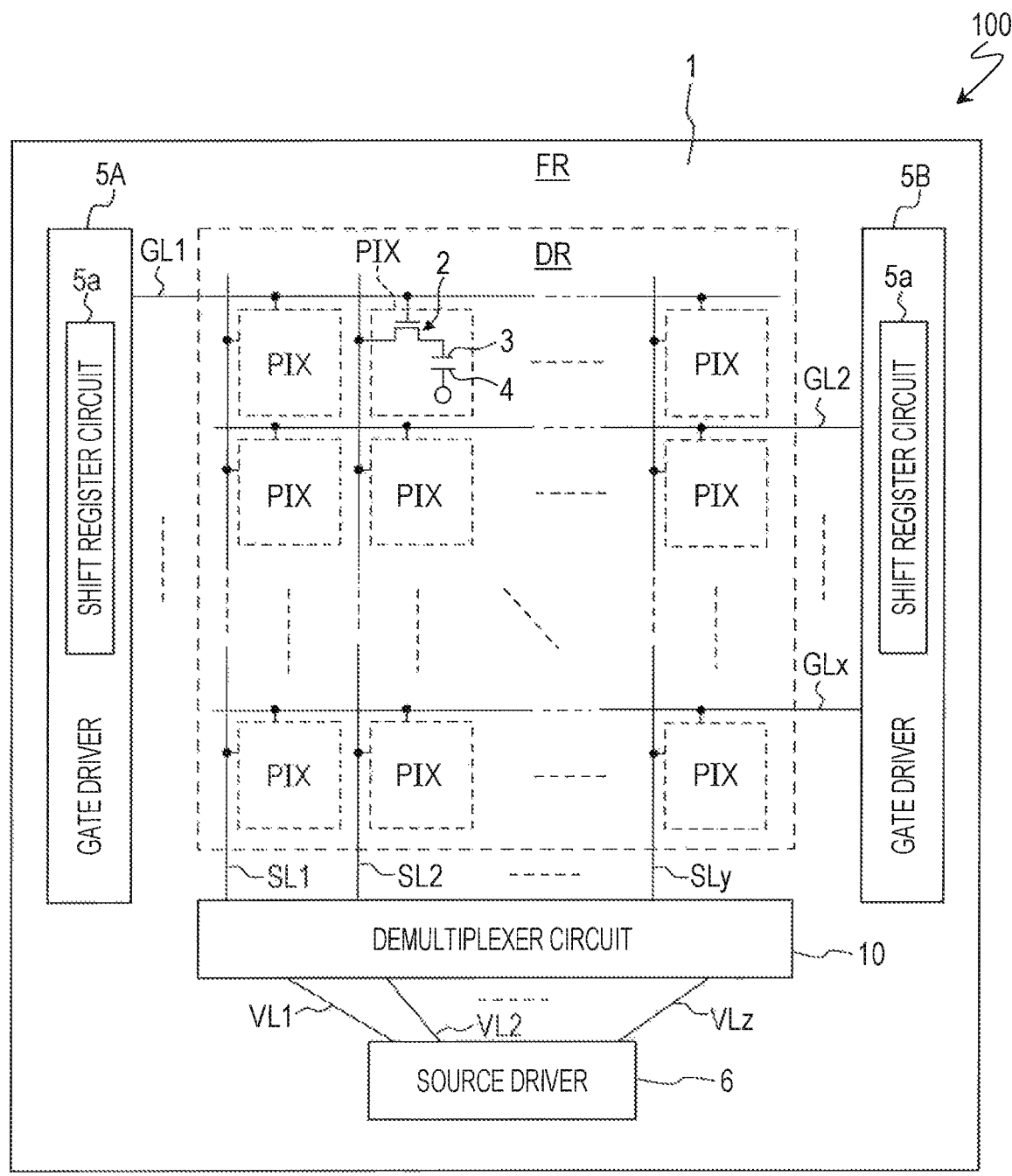
FIG. 1 is a view schematically illustrating an example of a plane structure of an active matrix substrate 100 of a first embodiment.

FIG. 1 is a view schematically illustrating an example of a plane structure of an active matrix substrate 100 of the present invention. As illustrated in FIG. 1, the active matrix substrate 100 includes a display region DR and a peripheral region FR.

The display region DR includes a plurality of pixel regions PIX. The pixel regions Pix are regions corresponding to pixels of a display device. In the following description, the pixel regions PIX are also sometimes referred to simply as "pixels". The plurality of pixel regions PIX are arranged in a matrix form including a plurality of rows and a plurality of columns. The plurality of pixel regions PIX arranged in a matrix form defines the display region DR.

The peripheral region FR is located in the periphery of the display region DR. The peripheral region FR is a region which does not contribute to displaying and which is also referred to as a "non-display region" or a "frame region".

The active matrix substrate 100 includes components supported by a substrate 1. The substrate 1 is, for example, a glass substrate.

On the substrate 1, a plurality of gate bus lines (scan line) GL and a plurality of gate bus lines (signal line) SL are provided. Each of the plurality of gate bus lines GL extends along a row direction. Each of the plurality of source bus lines SL extends along a column direction. In FIG. 1, the gate bus lines GL in a first row, a second row, . . . an xth row are respectively denoted by "GL1", "GL2", . . . "GLx", and the source bus lines SL in a first column, a second column, . . . a yth column are respectively denoted by "SL1", "SL2", . . . "SLy".

Typically, a region surrounded by two gate bus lines GL adjacent to each other and two source bus lines SL adjacent to each other is the pixel region PIX. Each pixel region PIX includes a thin film transistor 2 and a pixel electrode 3.

The thin film transistor 2 is also referred to as a "pixel TFT". The thin film transistor 2 has a gate electrode and a source electrode respectively connected to a corresponding one of the gate bus lines GL and a corresponding one of the source bus lines SL. The thin film transistor 2 has a drain electrode connected to the pixel electrode 3. When the active matrix substrate 100 is adopted in a liquid crystal display device in a lateral electric field mode such as a Fringe Field Switching (FFS) mode, the active matrix substrate 100 is provided with an electrode (common electrode) 4 common to the plurality of pixel regions PIX. When the active matrix substrate 100 is adopted in a liquid crystal display device in a vertical electric field mode, the common electrode 4 is provided on a counter substrate disposed to face the active matrix substrate 100 via a liquid crystal layer.

In the peripheral region FR, gate drivers (scan line drive circuits) 5A and 5B configured to drive the gate bus lines GL, a source driver (signal line drive circuit) 6 configured to drive the source bus lines SL, and a demultiplexer (DEMUX) circuit 10 are disposed. The DEMUX circuit 10 functions as a SSD circuit configured to drive the source bus lines SL in a time-division manner. In the present embodiment, the gate drivers 5A and 5B and the DEMUX circuit 10 are integrally (monolithically) formed on the substrate 1, and a source driver 6 is mounted on the substrate 1 (e.g., mounted by the COG technology).

In the example shown in the figure, the gate driver 5A for driving the gate bus lines GL in the odd rows is disposed on the left of the display region DR, and the gate driver 5B for driving the gate bus lines GL in the even rows is disposed on the right of the display region DR. The gate driver 5A has a plurality of output terminals (not shown) each connected to a corresponding one of the gate bus lines GL in the odd rows. Moreover, the gate driver 5B has a plurality of output terminals (not shown) each connected to a corresponding one of the gate bus lines GL in the even rows. Each of the gate drivers 5A and 5B includes a shift register circuit 5a.

The source driver 6 is disposed on a lower side of the display region DR, and the DEMUX circuit 10 is disposed between the source driver 6 and the display region DR. The source driver 6 includes a plurality of output terminals (not shown). In an area located between the source driver 6 and the DEMUX circuit 10, a plurality of signal output lines (video signal lines) VL are provided. Each of the plurality of signal output lines VL is connected to a corresponding one of the plurality of output terminals of the source driver 6. In FIG. 1, first, second, . . . zth signal output lines VL are respectively denoted by "VL1", "VL2", . . . "VLz".

Figure 2:
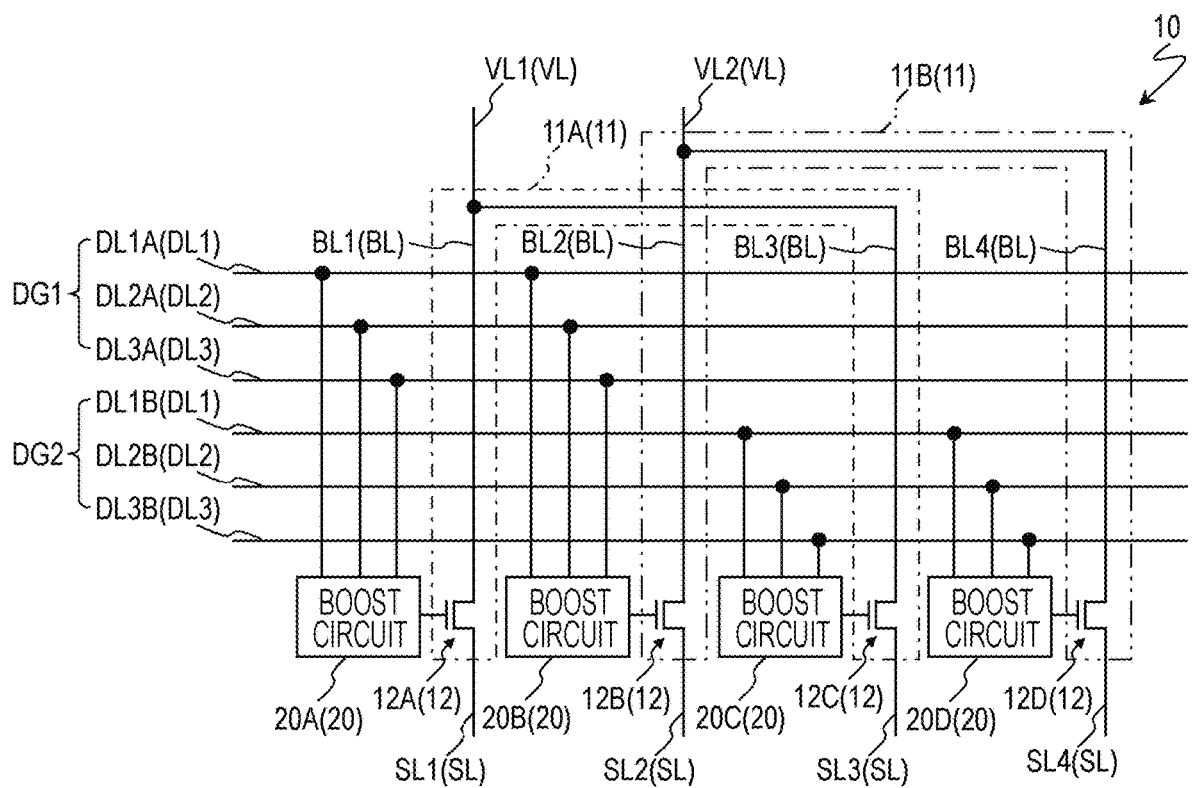
FIG. 2 is a view illustrating an example of a configuration of a DEMUX circuit 10 included in the active matrix substrate 100.

The DEMUX circuit 10 distributes a display signal supplied from one signal output line VL to two or more source bus lines SL. With reference to FIG. 2, the DEMUX circuit 10 will be described in further detail below. FIG. 2 is a view illustrating an example of a configuration of the DEMUX circuit 10.

As illustrated in FIG. 2, the DEMUX circuit 10 includes a plurality of unit circuits 11 supported by the substrate 1. Each of the plurality of unit circuits 11 distributes a display signal from one signal output line VL to n (n is an integer larger than or equal to 2) source bus lines SL. FIG. 2 shows a case where n=2, that is, a case where each unit circuit 11 distributes a display signal from one signal output line VL to two source bus lines SL. FIG. 2 shows two unit circuits 11. One unit circuit (hereinafter also referred to as a "first unit circuit") 11A of the two unit circuits 11 distributes a display signal from the signal output line VL1 to the source bus lines SL1 and SL3, and the other unit circuit (hereinafter also referred to as a "second unit circuit") 11B of the two unit circuits 11 distributes a display signal from the signal output line VL2 to the source bus lines SL2 and SL4.

Each unit circuit 11 includes n (here, two) branch lines BL and n (here, two) switching TFTs 12.

The two branch lines BL of each unit circuit 11 are connected to one signal output line VL. Moreover, each of the two switching TFTs 12 of each unit circuit 11 is connected to a corresponding one of the two branch lines BL. The two switching TFTs 12 individually (independently) perform on/off control of electrical connections of the two branch lines BL to the two source bus lines SL. In the present embodiment, each of the two switching TFTs 12 includes, as an active layer, an oxide semiconductor layer (i.e., an oxide semiconductor TFT).

Of two switching TFTs 12A and 12C of the first unit circuit 11A, the switching TFT 12A performs on/off control of an electrical connection of a branch line BL to the source bus line SL1, and the switching TFT 12C performs on/off control of an electrical connection of a branch line BL3 to the source bus line SL3. The switching TFT 12A has a source electrode and drain electrode respectively connected to the branch line BL and the source bus line SL1, and the switching TFT 12C has a source electrode and a drain electrode respectively connected to the branch line BL3 and the source bus line SL3.

Of two switching TFTs 12B and 12D of the first unit circuit 11B, the switching TFT 12B performs on/off control of an electrical connection of a branch line BL2 to the source bus line SL2, and the switching TFT 12D performs on/off control of an electrical connection of a branch line BL4 to the source bus line SL4. The switching TFT 12B has a source electrode and drain electrode respectively connected to the branch line BL2 and the source bus line SL2, and the switching TFT 12D has a source electrode and a drain electrode respectively connected to the branch line BL4 and the source bus line SL4.

As illustrated in FIG. 2, the DEMUX circuit 10 of the present embodiment further includes a plurality of boost circuits 20 configured to boost a voltage to be applied to the gate electrodes of n (here, two) switching TFTs 12 of each unit circuit 11. In an example shown in FIG. 2, the boost circuits 20 are connected to the switching TFTs 12 on a one-to-one basis. Specifically, gate electrodes of the switching TFTs 12A, 12B, 12C, and 12D are respectively connected to output sides of the boost circuits 20A, 20B, 20C, and 20D.

In the example shown in FIG. 2, each boost circuit 20 is driven with a drive signal group supplied via a first drive signal line DL1, a second drive signal line DL2, and a third drive signal line DL3. In the following description, a drive signal supplied via the first drive signal line DL1 is sometimes also referred to as a "first drive signal", a drive signal supplied via the second drive signal line DL2 is sometimes also referred to as a "second drive signal", and a drive signal supplied via the third drive signal line DL3 is sometimes also referred to as a "third drive signal". As described in detail later, in accordance with amplitudes of the first drive signal, the second drive signal, and the third drive signal, the boost circuit 20 boosts a voltage to increase the driving amplitude of a gate potential of the switching TFT 12.

In the example shown in FIG. 2, two systems of drive signal line groups DG1 and DG2 are provided. The boost circuits 20A and 20B are driven by a first drive signal line DL1A, a second drive signal line DL2A, and a third drive signal line DL3A of the drive signal line group DG1 of the drive signal line groups DG1 and DG2. Moreover, the boost circuits 20C and 20D are driven by a first drive signal line DL1B, a second drive signal line DL2B, and a third drive signal line DL3B of the drive signal line group DG2 of the drive signal line groups DG1 and DG2.

As described above, in the active matrix substrate 100 of the present embodiment, the DEMUX circuit 10 includes the boost circuit 20 configured to boost a voltage to be applied to the gate electrode of the switching TFT 12, and therefore, it is possible to increase an effective drive voltage of the DEMUX circuit. This enables a drive signal having a relatively small amplitude to drive the DEMUX circuit, and therefore, it is possible to reduce power consumption due to charging and discharging of the drive signal. Moreover, the boost circuit 20 enables a voltage (drive voltage) which is to be applied to the gate electrode of the switching TFT 12 to be increased, and therefore, it is possible to reduce resistance (on-resistance) of the switching TFT 12 at the time of selection so as to increase charging capacity. Moreover, it is possible to increase the drive voltage, and therefore, it is also possible to reduce the size of the switching TFT 12. This enables the layout size of the DEMUX circuit 10 to be reduced, and it is possible to narrow the peripheral region FR (perform frame narrowing). In this way, the embodiment of the present invention enables both drive power reduction and frame narrowing of an active matrix substrate including the DEMUX circuit.

Figure 3:
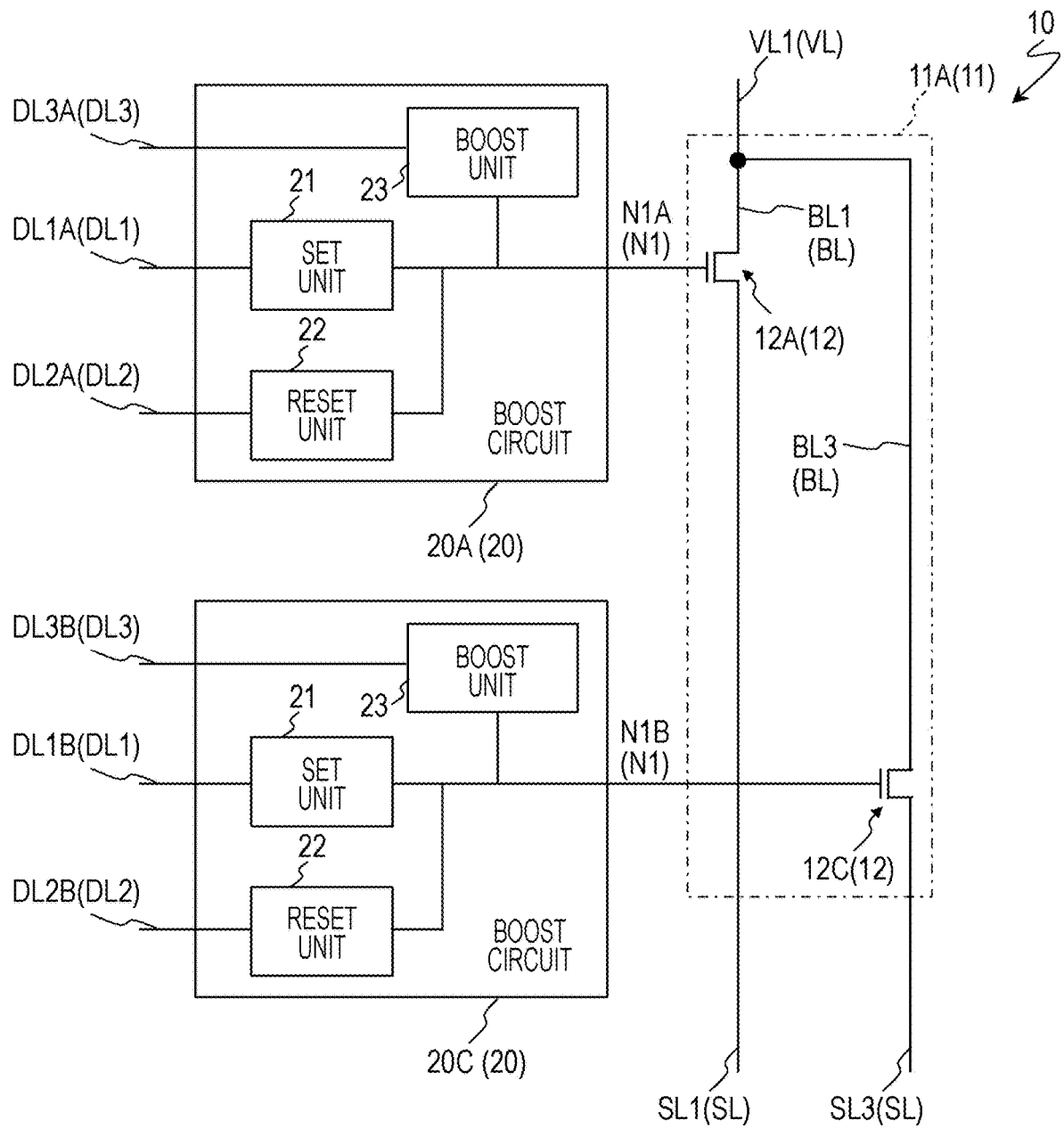
FIG. 3 is a view illustrating an example of a configuration of a boost circuit 20 included in the DEMUX circuit 10.

Subsequently, with reference to FIG. 3, a specific configuration of the boost circuit 20 will be described. FIG. 3 is a view illustrating an example of a configuration of the boost circuit 20.

In the example shown in FIG. 3, each boost circuit 20 includes a set unit 21, a reset unit 22, and a boost unit 23. The set unit 21, the reset unit 22, and the boost unit 23 are connected to a first node N1 connected to the gate electrode of the switching TFT 12. Moreover, the set unit 21 is connected to the first drive signal line DL1, the reset unit 22 is connected to the second drive signal line DL2, and the boost unit 23 is connected to the third drive signal line DL3.

The set unit 21 is supplied with the first drive signal (set signal) via the first drive signal line DL1 to pre-charge the first node N1. The boost unit 23 is supplied with the third drive signal (boost signal) via the third drive signal line DL3 to boost the potential of the first node N1 pre-charged by the set unit 21. The reset unit 22 is supplied with the second drive signal (reset signal) via the second drive signal line DL2 to reset the potential of the first node N1.

Figure 4:
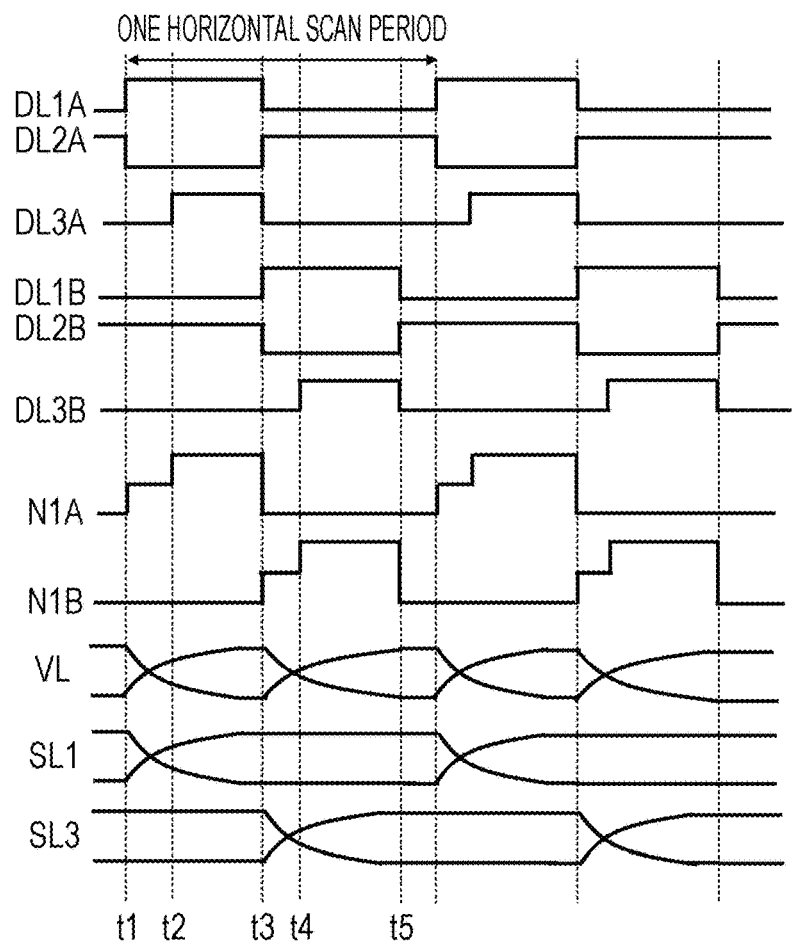
FIG. 4 is a timing diagram illustrating operation of the DEMUX circuit 10.

With reference to also FIG. 4, operation (of the DEMUX circuit 10) of the boost circuit 20 will now be described. FIG. 4 is a timing diagram illustrating operation of the DEMUX circuit 10. FIG. 4 shows potentials of the first drive signal lines DL1A and DL1B, the second drive signal lines DL2A and DL2B, the third drive signal lines DL3A and DL3B, first nodes N1A and N1B, the signal output line VL, and the source bus lines SL1 and SL3.

First, at time t1, the potential of the first drive signal line DL1A transitions to a high level, the potential of the second drive signal line DL2A transitions to a low level, and the first drive signal is input as the set signal to the set unit 21 of the boost circuit 20A. Thus, the first node N1A connected to the gate electrode of the switching TFT 12A is pre-charged. Moreover, at this timing, the level of the potential of the signal output line VL (i.e., display signal) changes to a write voltage level, and the source bus line SL1 selected is started to be charged.

Then, at time t2, the potential of the third drive signal line DL3A transitions to the high level, and the third drive signal is input as a boost signal to the boost unit 23 of the boost circuit 20A. This boosts the potential of the first node N1A. Boosting the potential of the first node N1A satisfactorily charges the source bus line SL1 via the switching TFT 20A.

Subsequently, at time t3, the potential of the first drive signal line DL1A transitions to the low level, the potential of the second drive signal line DL2A transitions to the high level, the potential of the third drive signal line DL3A transitions to the low level, and the second drive signal is input as the reset signal to the reset unit 22 of the boost circuit 20A. Thus, the potential of the first node N1A is reset. At this timing, the switching TFT 20A transitions to an OFF state, and the potential of the source bus line SL1 is determined.

Moreover, at time t3, the potential of the first drive signal line DL1B transitions to the high level, the potential of the second drive signal line DL2B transitions to the low level, and the first drive signal is input as the set signal to the set unit 21 of the boost circuit 20B. Thus, the first node N1B connected to the gate electrode of the switching TFT 12B is pre-charged. Moreover, at this timing, the level of the potential of the signal output line VL (i.e., display signal) changes to the write voltage level to start charging of the source bus line SL3 selected.

Then, at time t4, the potential of the third drive signal line DL3B transitions to the high level, and the third drive signal is input as a boost signal to the boost unit 23 of the boost circuit 20B. This boosts the potential of the first node N1B. Boosting the potential of the first node N1B satisfactorily charges the source bus line SL3 via the switching TFT 20B.

Then, at time t5, the potential of the first drive signal line DL1B transitions to the low level, the potential of the second drive signal line DL2B transitions to the high level, the potential of the third drive signal line DL3B transitions to the low level, and the second drive signal is input as the reset signal to the reset unit 22 of the boost circuit 20B. Thus, the potential of the first node N1B is reset. At this timing, the switching TFT 12B transitions to the OFF state, and the potential of the source bus line SL3 is determined.

When writing to the source bus lines SL1 and SL3 is completed (potential is determined), the gate signal supplied via the gate bus line GL transitions to an OFF level, and writing of a display voltage to the pixel PIX is completed.

Figure 5:
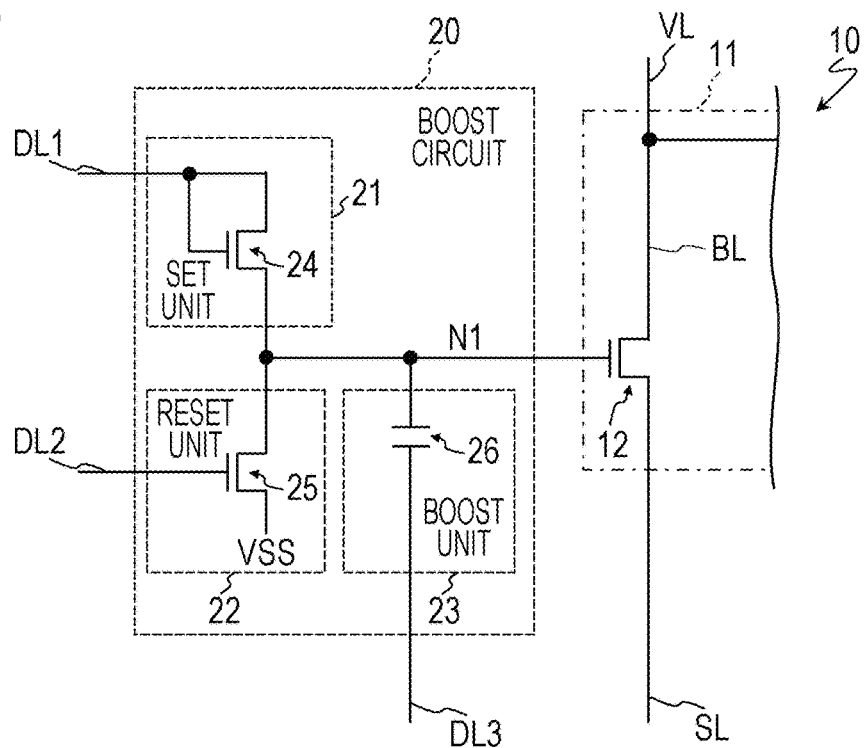
FIG. 5 is a view illustrating an example of specific configurations of a set unit 21, a reset unit 22, and a boost unit 23 included in the boost circuit 20.

With reference to FIG. 5, a more specific configuration of the boost circuit 20 will be described. FIG. 5 is a view illustrating an example of specific configurations of the set unit 21, the reset unit 22, and the boost unit 23 of the boost circuit 20.

In the example shown in FIG. 5, the set unit 21 includes a TFT (hereinafter referred to as a "setting TFT") 24. The setting TFT 24 is diode-connected, and the setting TFT 24 includes a gate electrode and a drain electrode connected to the first drive signal line DL1. Moreover, the setting TFT 24 includes a source electrode connected to the first node N1.

The reset unit 22 includes a TFT (hereinafter referred to as a "resetting TFT") 25. The resetting TFT 25 includes a gate electrode connected to the second node DL2. The resetting TFT 25 is configured to pull down the potential of the first node N1. Specifically, the resetting TFT 25 includes a source electrode to which a constant potential (negative power supply potential VSS) is given, and the resetting TFT 25 includes a drain electrode connected to the first node N1.

The boost unit 23 includes a capacitive element (hereinafter referred to as a "boosting capacitive element") 26. The boosting capacitive element 26 includes an electrode (first capacitance electrode) connected to the third drive signal line DL3 and an electrode (second capacitance electrode) connected to the first node N1.

Figure 6:
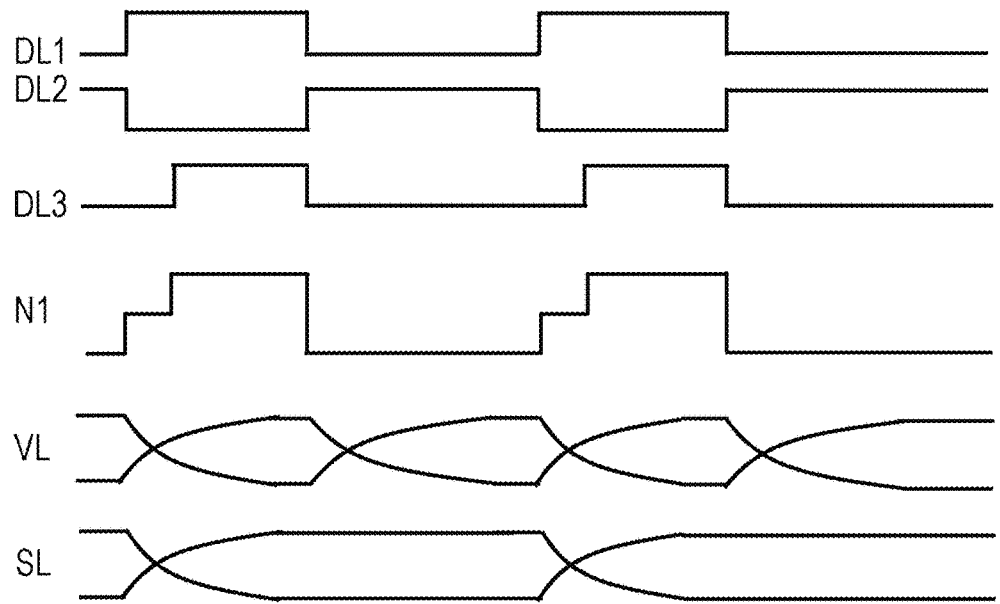
FIG. 6 is a timing diagram illustrating operation of the boost circuit 20.

With reference to FIG. 6, operation of the boost circuit 20 shown in FIG. 5 will be described. FIG. 6 is a timing diagram illustrating operation of the boost circuit 20. FIG. 6 shows potentials of the first drive signal line DL1, the second drive signal line DL2, the third drive signal line DL3, the first node N1, the signal output line VL, and the source bus line SL. In the following description, a high level and a low level of the potentials of the first drive signal line DL1, the second drive signal line DL2, and the third drive signal line DL3 are respectively referred to as "VDH" and "VDL". The VDH is, for example, 10 V, and the VDL is, for example, −10 V.

First, when the level of the potential (set signal) of the first drive signal line DL1 changes from the low level to the high level, the setting TFT 24 transitions to an ON state, and the first node N1 is pre-charged. Here, the setting TFT 24 is diode-connected, and therefore, assuming that the threshold voltage of the setting TFT 24 is Vth, the first node N1 is pre-charged to a (VDH−Vth) potential.

Then, when the level of the potential (boost signal) of the third drive signal line DL3 changes from the low level to the high level, the potential of the first node N1 is boosted. The degree of boosting varies depending on a ratio of a capacitance value Cbst of the boosting capacitive element 26 to a sum (total load capacitance) Cn1 of the load capacitance of the first node N1. Specifically, the potential by which boosting is performed is obtained by multiplying a boosted voltage (=VDH−VDL) by (Cbst/Cn1). Thus, for example, when the total load capacitance Cn1 of the first node N1 is 0.2 pF, and the capacitance value Cbst of the boosting capacitive element 26 is 0.1 pF, the potential of the first node N1 is boosted from (VDH−Vth) to {(VDH−Vth)+(VDH−VDL)×(0.1/0.2)}. When VDH=10 V, VDL=−10 V, and Vth=2 V, the potential of the first node N1 is boosted to 18 V.

Second Embodiment

Figure 7:
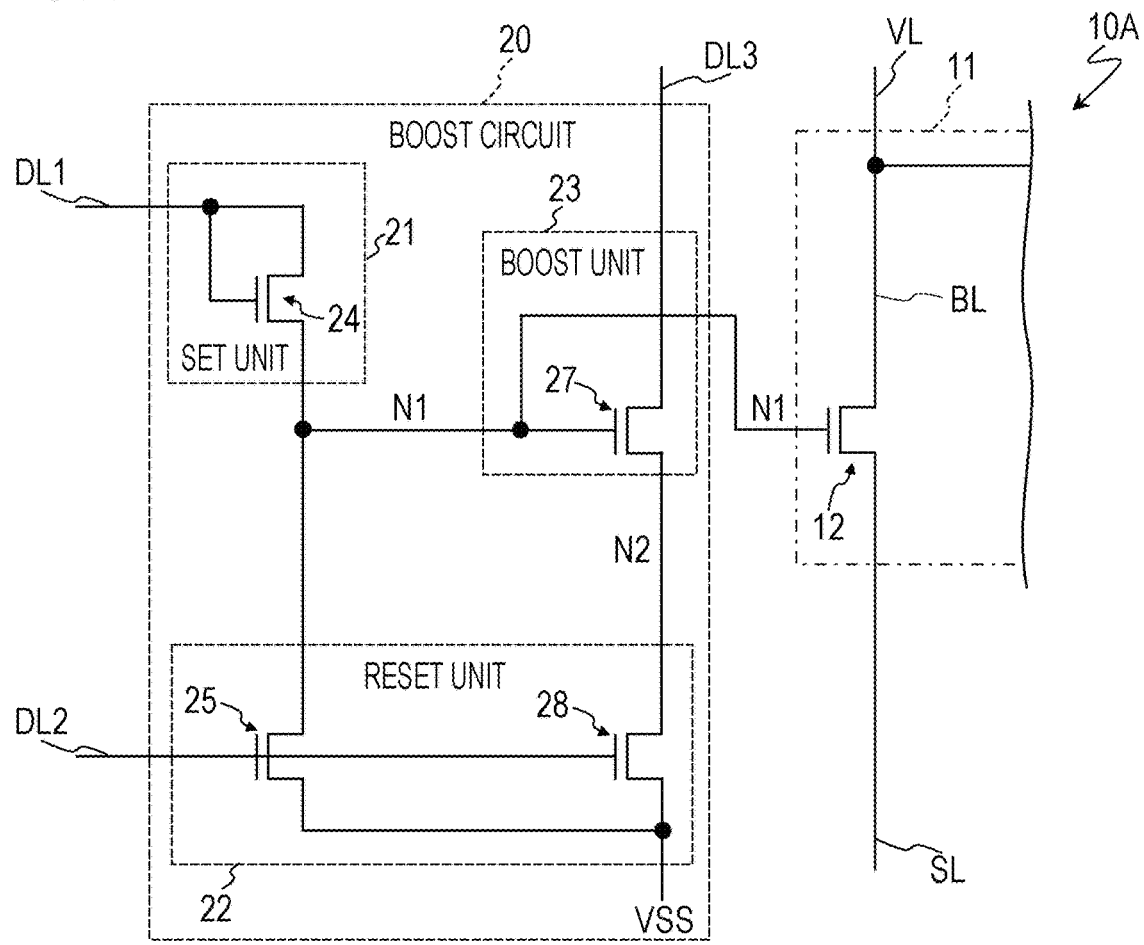
FIG. 7 is a view illustrating a configuration of a DEMUX circuit 10A included in an active matrix substrate of a second embodiment.

With reference to FIG. 7, an active matrix substrate of the present embodiment will be described. FIG. 7 is a view illustrating a configuration of a DEMUX circuit 10A included in the active matrix substrate of the present embodiment.

In the DEMUX circuit 10 shown in FIG. 5, the boost unit 23 of the boost circuit 20 includes the boosting capacitive element 26. In contrast, in the DEMUX circuit 10A of the present embodiment, a boost unit 23 includes a TFT (hereinafter referred to as a "boosting TFT") 27 as shown in FIG. 7. The boosting TFT 27 includes a gate electrode connected to a first node N1, and the boosting TFT 27 includes a drain electrode connected to a third drive signal line DL3. The boosting TFT 27 includes a source electrode connected to a second node N2 different from the first node N1.

In the DEMUX circuit 10 shown in FIG. 5, the reset unit 22 of the boost circuit 20 includes one resetting TFT 25. In contrast, in the DEMUX circuit 10A of the present embodiment, a reset unit 22 includes two resetting TFTs 25 and 28 configured to pull down a potential of the first node N1 as illustrated in FIG. 7.

The resetting TFT (first resetting TFT) 25 of the resetting TFTs 25 and 28 includes a gate electrode connected to a second drive signal line DL2. Moreover, the first resetting TFT 25 includes a source electrode to which a constant potential (negative power supply potential VSS) is given, and the first resetting TFT 25 includes a drain electrode connected to the first node N1.

The resetting TFT (second resetting TFT) 28 of the resetting TFTs 25 and 28 includes a gate electrode connected to the second drive signal line DL2. Moreover, the second resetting TFT 28 includes a source electrode to which a constant potential (negative power supply potential VSS) is given, and the second resetting TFT 28 includes a drain electrode connected to the second node N2 (i.e., the source electrode of the boosting TFT 27 via the second node N2).

In the present embodiment, the boost unit 23 includes the boosting TFT 27 but not the boosting capacitive element 26, which enables a signal load to be reduced, and therefore, it is possible to further reduce consumed power and further increase the speed. Also when the boost unit 23 includes the boosting TFT 27, as in the case for the boost unit 23 including the boosting capacitive element 26, it is possible to drive the boost circuit 20 by a drive signal as shown in the timing diagram as exemplarily shown in FIG. 4.

When the boost unit 23 includes the boosting TFT 27, the boost level by the boost circuit 20 is determined based on the ratio of a capacitance value Ctft_on in an ON state of the boosting TFT 27 to a total load capacitance Cn1 of the first node N1. Thus, when the capacitance value Ctft_on is equal to a capacitance value Cbst of the boosting capacitive element 26, the boost level is equal to that in the case where the boost unit 23 includes the boosting capacitive element 26.

Figure 8:
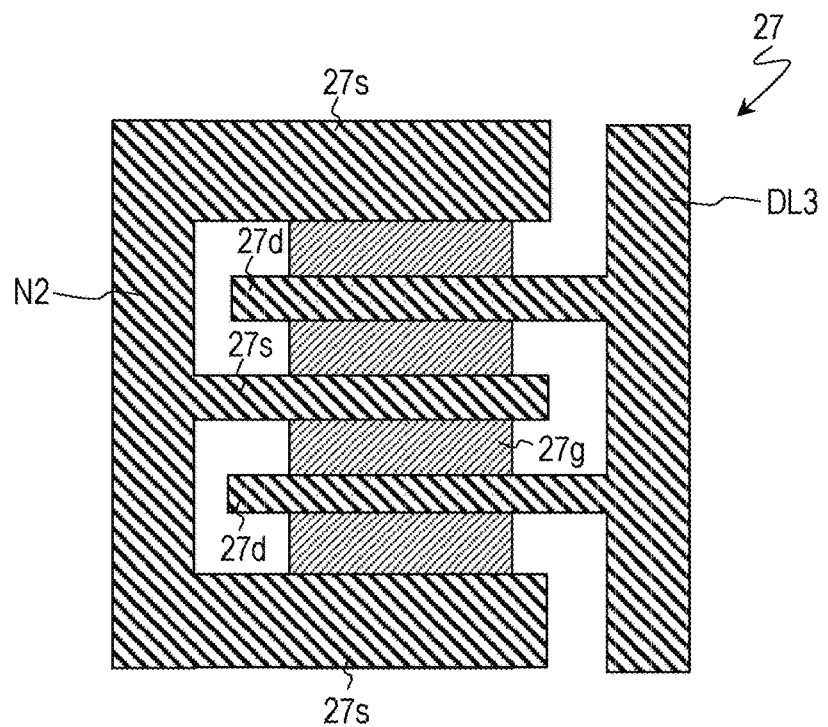
FIG. 8 is a plan view illustrating an example of an electrode layout of a boosting TFT 27 included in a boost circuit 20 of the DEMUX circuit 10A.

To more efficiently boost the first node N1, the boosting TFT 27 preferably has an electrode layout which reduces capacitance hanging down from the third drive signal line DL3 as small as possible. FIG. 8 shows the electrode layout of the boosting TFT 27 (shapes and arrangement of a gate electrode 27g, a source electrode 27s, and a drain electrode 27d).

In the example shown in FIG. 8, the source electrode 27s is extended to be branched from a line connected to the second node N2 (denoted by the same reference sign "N2" as the second node N2). Moreover, the drain electrode 27d is extended to be branched from the third drive signal line DL3, and the gate electrode 27g is arranged not to overlap the third drive signal line DL3 itself. Thus, it is possible to reduce capacitance hanging down from the third drive signal line DL3.

Third Embodiment

Figure 9:
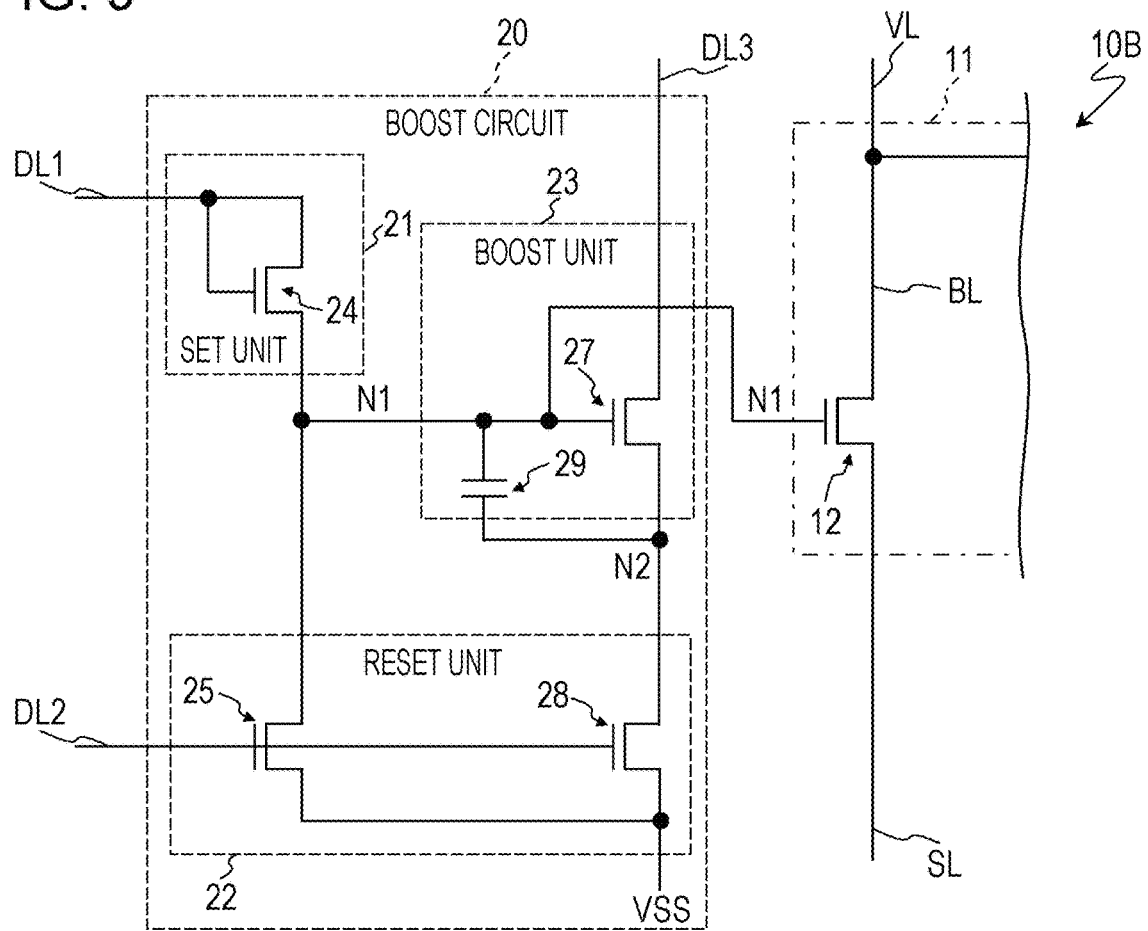
FIG. 9 is a view illustrating a configuration of a DEMUX circuit 10B included in an active matrix substrate of a third embodiment.

With reference to FIG. 9, an active matrix substrate of the present embodiment will be described. FIG. 9 is a view illustrating a configuration of a DEMUX circuit 10B included in the active matrix substrate of the present embodiment.

In the DEMUX circuit 10A shown in FIG. 7, the boost unit 23 includes the boosting TFT 27. In contrast, in the DEMUX circuit 10B of the present embodiment, a boost unit 23 includes a capacitive element (boosting capacitive element) 29 in addition to the boosting TFT 27 as shown in FIG. 9. The boosting capacitive element 29 includes an electrode (first capacitive electrode) connected to a first node N1 and an electrode (second capacitive electrode) connected to a second node N2.

As shown in the present embodiment, a boost unit 23 includes the boosting capacitive element 29 in addition to the boosting TFT 27, and therefore, it is possible to more efficiently boost the potential of the first node N1. Moreover, it is also possible to obtain the effect of preventing oscillation.

Fourth Embodiment

Figure 10:
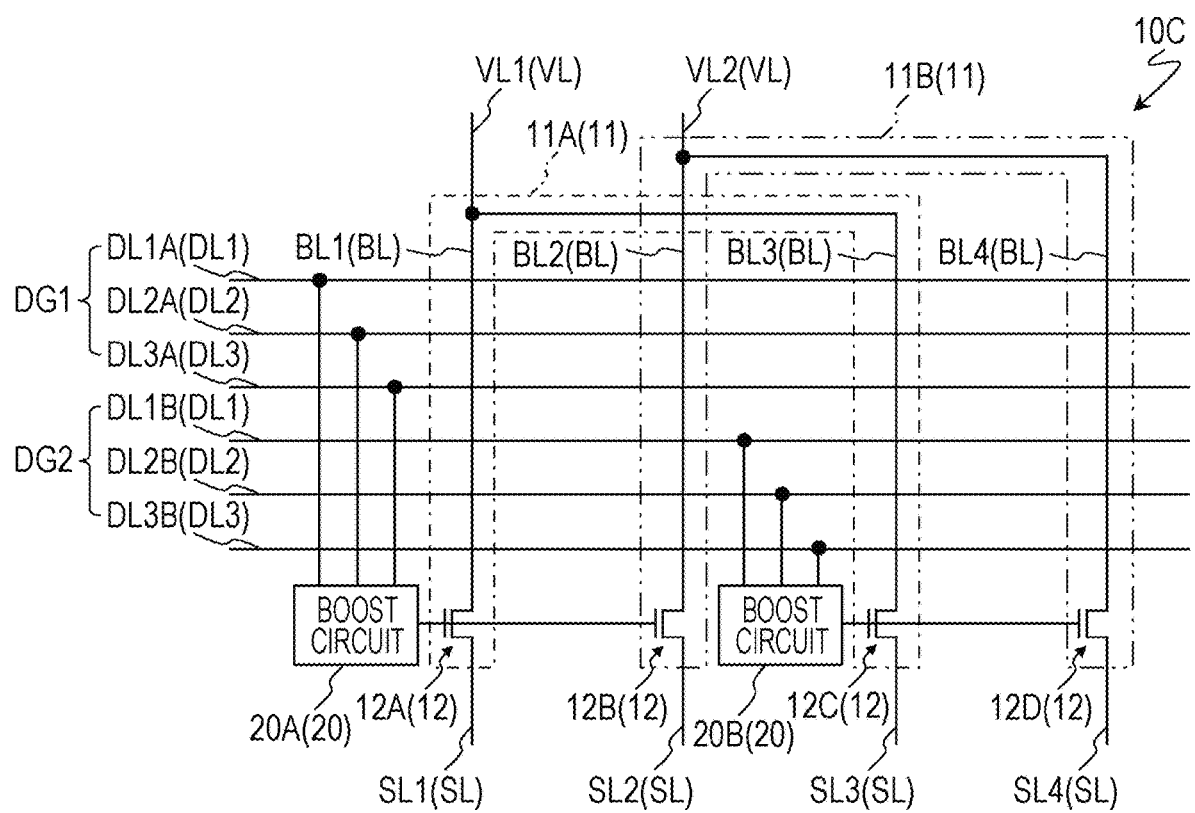
FIG. 10 is a view illustrating a configuration of a DEMUX circuit 10C included in an active matrix substrate of a fourth embodiment.

With reference to FIG. 10, an active matrix substrate of the present embodiment will be described. FIG. 10 is a view illustrating a configuration of a DEMUX circuit 10C included in the active matrix substrate of the present embodiment.

In the DEMUX circuit 10 shown in FIG. 2, the boost circuits 20 are connected to the switching TFTs 12 on a one-to-one basis. In contrast, in the DEMUX circuit 10C of the present embodiment, one boost circuit 20 is connected to two switching TFTs 12 as illustrated in FIG. 10. Specific description will be given below.

The two switching TFTs 12 included in a first unit circuit 11A are a first switching TFT 12A and a second switching TFT 12C which are brought into an ON state at different timings during one horizontal scan period. Similarly, the two switching TFTs 12 included in a second unit circuit 11B are a first switching TFT 12B and a second switching TFT 12D which are brought into an ON state at different timings in one horizontal scan period.

Of two boost circuits 20A and 20B shown in FIG. 10, the boost circuit 20A is commonly connected to the first switching TFT 12A of the first unit circuit 11A and the first switching TFT 12B of the second unit circuit 11B, and the boost circuit 20B is commonly connected to the second switching TFT 12C of the first unit circuit 11A and the second switching TFT 12D of the second unit circuit 11B.

Thus, in the present embodiment, two switching TFTs 12 which are simultaneously selected share one boost circuit 20. This enables the number of circuit elements to be reduced. Moreover, reducing the number of circuit elements reduces the load, and thus, it is possible to further reduce consumed power. Moreover, reducing the number of circuit elements also enables a circuit area to be reduced, and therefore, it is possible to reduce the layout size, and further frame narrowing is possible.

Fifth Embodiment

Figure 11:
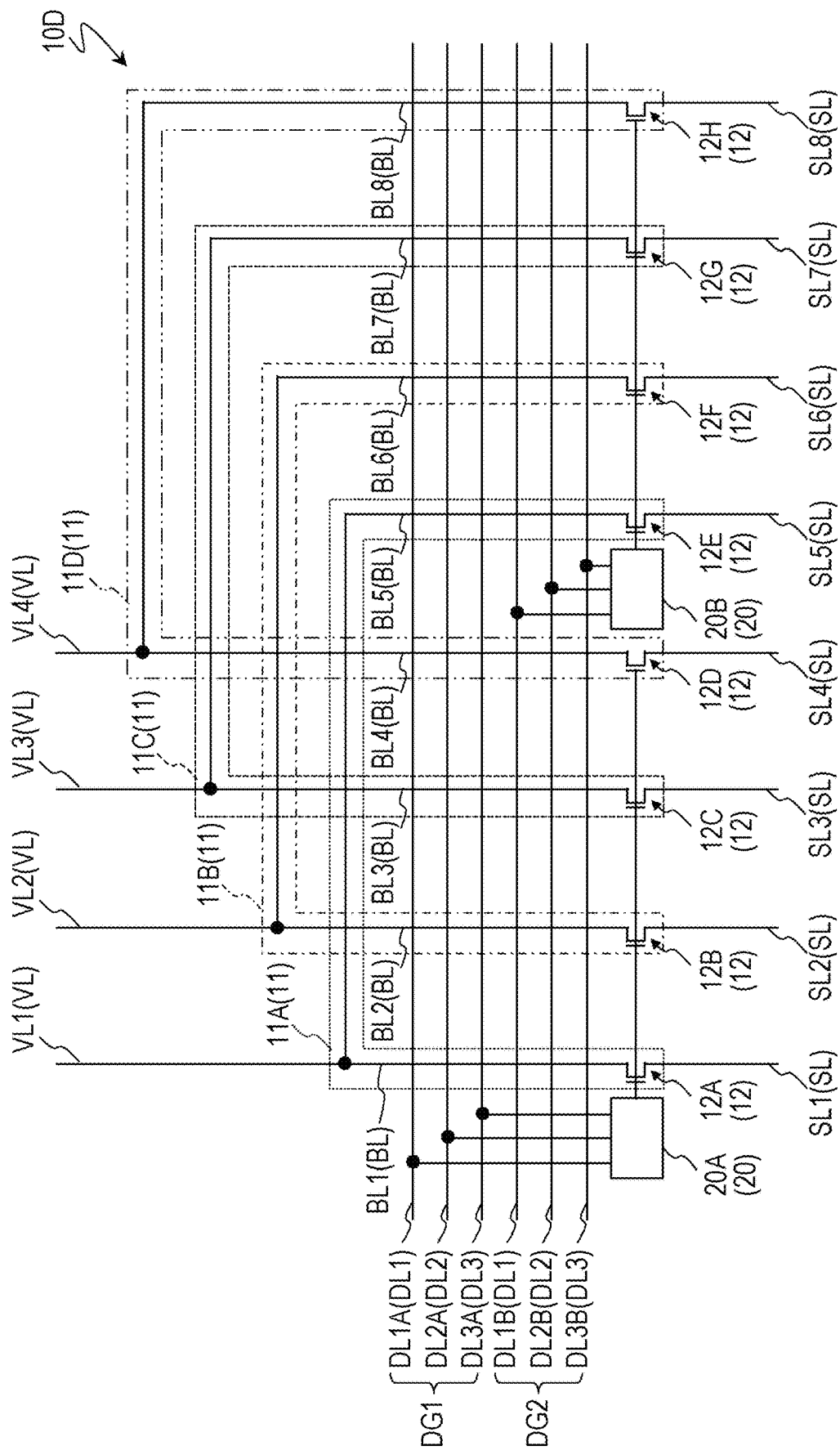
FIG. 11 is a view illustrating a configuration of a DEMUX circuit 10D included in an active matrix substrate of a fifth embodiment.

In the DEMUX circuit 10C in the fourth embodiment, the two switching TFTs 12 share one boost circuit 20, but three or more switching TFTs 12 may share one boost circuit 20. With reference to FIG. 11, an active matrix substrate of the present embodiment will be described below. FIG. 11 is a view illustrating a configuration of a DEMUX circuit 10D included in the active matrix substrate of the present embodiment.

FIG. 11 shows four unit circuits 11A, 11B, 11C, and 11D (hereinafter respectively referred to as a "first unit circuit", a "second unit circuit", a "third unit circuit", and a "fourth unit circuit") of a plurality of unit circuits 11 included in the DEMUX circuit 10D.

The first unit circuit 11A includes two branch lines BL1 and BL5 and two switching TFTs 12A and 12E and distributes a display signal from a signal output line VL to source bus lines SL1 and SL5. The two switching TFTs (first switching TFT and second switching TFT) 12A and 12E of the first unit circuit 11A are brought into the ON state at different timings during one horizontal scan period.

The second unit circuit 11B includes two branch lines BL2 and BL6 and two switching TFTs 12B and 12F and distributes a display signal from a signal output line VL2 to source bus lines SL2 and SL6. The two switching TFTs (first switching TFT and second switching TFT) 12B and 12F of the first unit circuit 11B are brought into the ON state at different timings during one horizontal scan period.

The third unit circuit 11C includes two branch lines BL3 and BL7 and two switching TFTs 12C and 12G and distributes a display signal from a signal output line VL3 to source bus lines SL3 and SL7. The two switching TFTs (first switching TFT and second switching TFT) 12C and 12G of the third unit circuit 11C are brought into the ON state at different timings during one horizontal scan period.

The fourth unit circuit 11D includes two branch lines BL4 and BL8 and two switching TFTs 12D and 12H and distributes a display signal from a signal output line VL4 to source bus lines SL4 and SL8. The two switching TFTs (first switching TFT and second switching TFT) 12D and 12H of the fourth unit circuit 11D are brought into the ON state at different timings during one horizontal scan period.

Of two boost circuits 20A and 20B shown in FIG. 11, the boost circuit 20A is commonly connected to the first switching TFT 12A of the first unit circuit 11A, the first switching TFT 12B of the second unit circuit 11B, the first switching TFT 12C of the third unit circuit 11C, and the first switching TFT 12D of the fourth unit circuit 11D. Moreover, the boost circuit 20B is commonly connected to the second switching TFT 12E of the first unit circuit 11A, the second switching TFT 12F of the second unit circuit 11B, the second switching TFT 12G of the third unit circuit 11C, and the second switching TFT 12H of the fourth unit circuit 11D.

Thus, in the present embodiment, four switching TFTs 12 which are simultaneously selected share one boost circuit 20. This enables the number of circuit elements to further be reduced as compared to the fourth embodiment in which two switching TFTs 12 share one boost circuit 20. Thus, it is possible to further reduce consumed power, and further frame narrowing is possible.

The present embodiment has described an example in which the four switching TFTs 12 share one boost circuit 20, but sharing one boost circuit 20 with three or more switching TFTs 12 enables the number of circuit elements to be more reduced than in the fourth embodiment. The three switching TFTs 12 which are simultaneously selected may share one boost circuit 20, or five or more switching TFTs 12 which are simultaneously selected may share one boost circuit 20.

Sixth Embodiment

Figure 12:
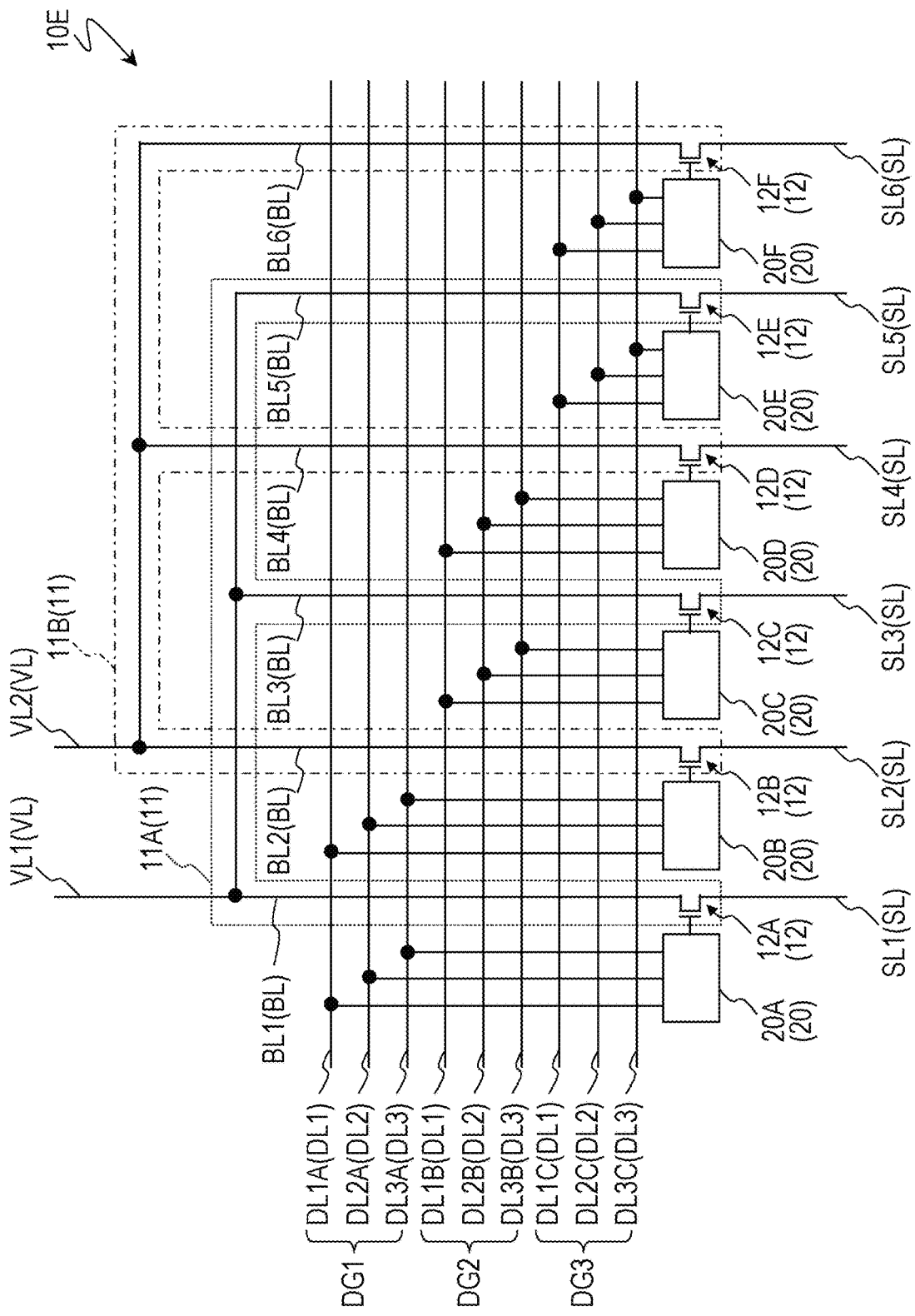
FIG. 12 is a view illustrating a configuration of a DEMUX circuit 10E included in an active matrix substrate of a sixth embodiment.

With reference to FIG. 12, an active matrix substrate of the present embodiment will be described. FIG. 12 is a view illustrating a configuration of a DEMUX circuit 10E included in the active matrix substrate of the present embodiment.

In the DEMUX circuits 10, 10C, and 10D respectively shown in FIGS. 2, 10, and 11, each unit circuit 11 distributes a display signal from one signal output line VL to two source bus lines SL. In contrast, in DEMUX circuit 10E of the present embodiment, each unit circuit 11 distributes a display signal from one signal output line VL to three source bus lines SL. Specific description will be given below.

FIG. 12 shows two unit circuits 11A and 11B (a first unit circuit and a second unit circuit) of a plurality of unit circuits 11 included in the DEMUX circuit 10E.

The first unit circuit 11A includes three branch lines BL1, BL3, and BL5 and three switching TFTs 12A, 12C, and 12E and distributes a display signal from a signal output line VL1 to three source bus lines SL1, SL3, and SL5.

The second unit circuit 11B includes three branch lines BL2, BL4, and BL6 and three switching TFTs 12B, 12D, and 12F and distributes a display signal from a signal output line VL2 to three source bus lines SL2, SL4, and SL6.

The DEMUX circuit 10E includes a plurality of boost circuits 20 configured to boost a voltage to be applied to gate electrodes of the three switching TFTs 12 of each unit circuit 11. In an example shown in FIG. 12, the boost circuits 20 are connected to the switching TFTs 12 on a one-to-one basis. Specifically, gate electrodes of the switching TFTs 12A, 12B, 12C, 12D, 12E, and 12F are respectively connected to output sides of boost circuits 20A, 20B, 20C, 20D, 20E, and 20F.

In the example shown in FIG. 12, three systems of drive signal line groups DG1, DG2, and DG3 are provided. The boost circuits 20A and 20B are driven by a first drive signal line DL1A, a second drive signal line DL2A, and a third drive signal line DL3A of the drive signal line group DG1. The boost circuits 20C and 20D are driven by a first drive signal line DL1B, a second drive signal line DL2B, and a third drive signal line DL3B of the drive signal line group DG2. The boost circuits 20E and 20F are driven by a first drive signal line DL1C, a second drive signal line DL2C, and a third drive signal line DL3C of the drive signal line group DG3.

Also in the active matrix substrate of the present embodiment, the DEMUX circuit 10E includes the boost circuits 20, and therefore, it is possible to reduce drive power in the same manner as in the active matrix substrate of the first to fifth embodiments. Moreover, in the present embodiment, each unit circuit 11 distributes a display signal from one signal output line VL to three source bus lines SL, and therefore, it is possible to reduce the number of signal output lines VL as compared to the first to fifth embodiments. Thus, a line region (region in which the signal output lines VL are disposed) is reduced to enable further frame narrowing. Moreover, the number of amplifiers of a source driver 6 which is mounted by using the COG technology, and therefore, it is possible to further reduce the chip size. Thus, the number of chips obtained from a wafer is increased, and it is possible to reduce chip cost.

Seventh Embodiment

Figure 13:
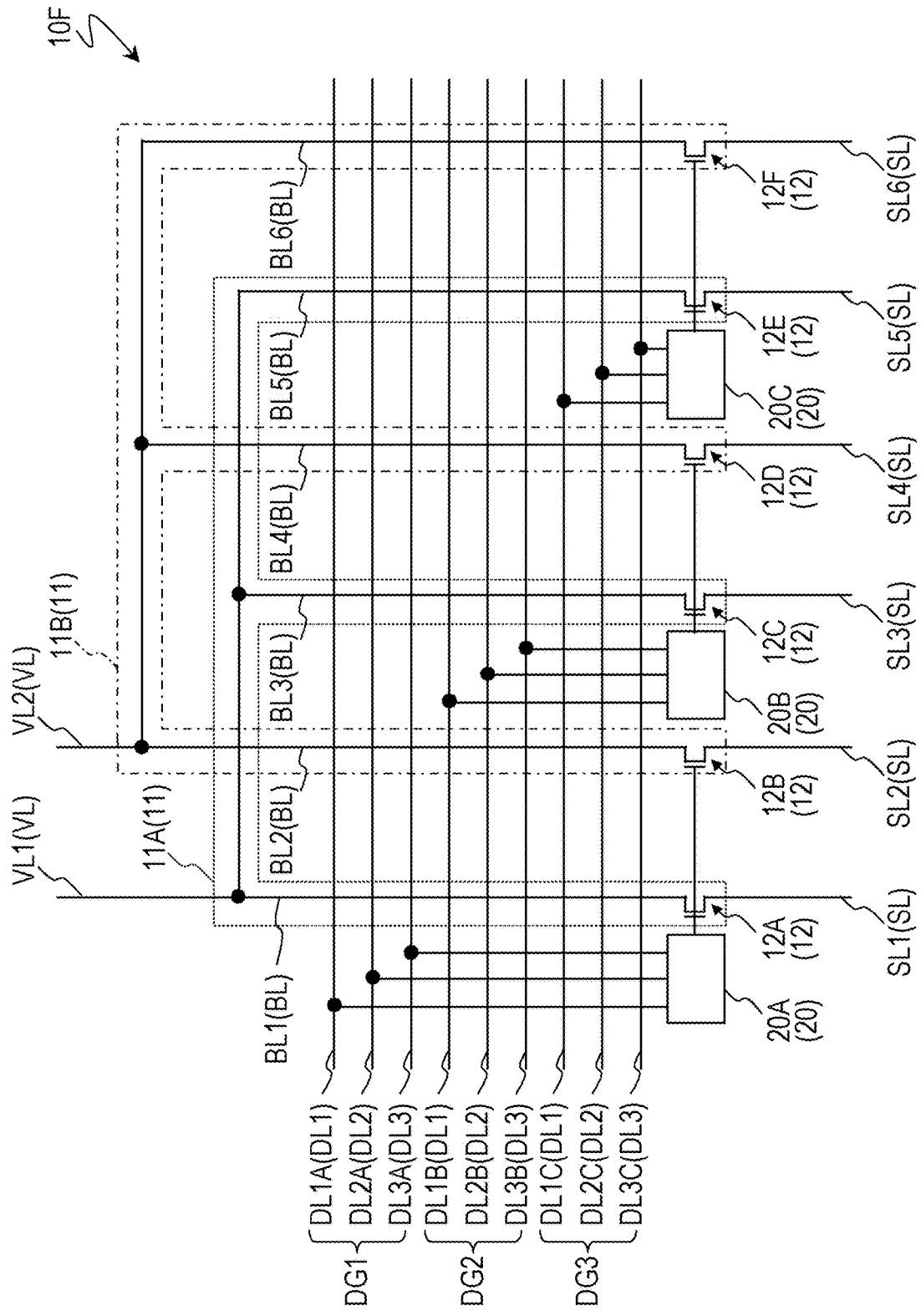
FIG. 13 is a view illustrating a configuration of a DEMUX circuit 10F included in an active matrix substrate of a seventh embodiment.

With reference to FIG. 13, an active matrix substrate of the present embodiment will be described. FIG. 13 is a view illustrating a configuration of a DEMUX circuit 10F included in the active matrix substrate of the present embodiment.

In the DEMUX circuit 10E shown in FIG. 12, the boost circuits 20 are connected to the switching TFTs 12 on a one-to-one basis. In contrast, in the DEMUX circuit 10F of the present embodiment, one boost circuit 20 is connected to two switching TFTs 12 as shown in FIG. 13. Specific description will be given below.

Three switching TFTs 12 included in a first unit circuit 11A are a first switching TFT 12A, a second switching TFT 12C, and a third switching TFT 12E which are brought into an ON state at different timings during one horizontal scan period. Similarly, three switching TFTs 12 included in a second unit circuit 11B are a first switching TFT 12B, a second switching TFT 12D, and a third switching TFT 12F which are brought into an ON state at different timings during one horizontal scan period.

Of three boost circuits 20A, 20B, and 20C shown in FIG. 13, the boost circuit 20A is commonly connected to the first switching TFT 12A of the first unit circuit 11A and the first switching TFT 12B of the second unit circuit 11B. Moreover, the boost circuit 20B is commonly connected to the second switching TFT 12C of the first unit circuit 11A and the second switching TFT 12D of the second unit circuit 11B. Furthermore, the boost circuit 20C is commonly connected to the third switching TFT 12E of the first unit circuit 11A and the third switching TFT 12F of the second unit circuit 11B.

Thus, in the present embodiment, two switching TFTs 12 which are simultaneously selected share one boost circuit 20. This enables the number of circuit elements to be reduced. Moreover, reducing the number of circuit elements reduces the load, and thus, it is possible to further reduce consumed power. Moreover, reducing the number of circuit elements also enables a circuit area to be reduced, and therefore, it is possible to reduce the layout size, and further frame narrowing is possible.

Eighth Embodiment

Figure 14:
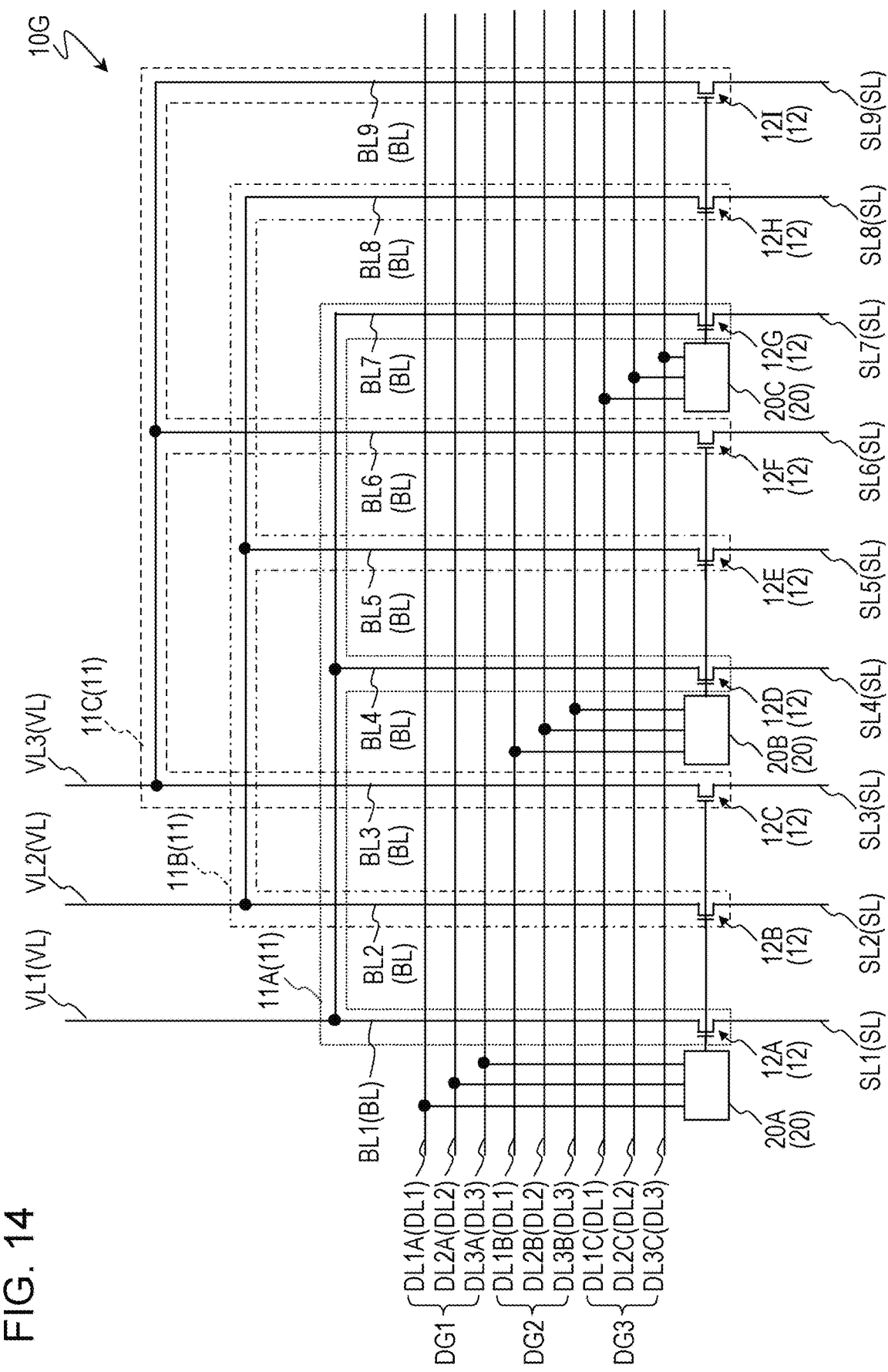
FIG. 14 is a view illustrating a configuration of a DEMUX circuit 10G included in an active matrix substrate of an eighth embodiment.

In the DEMUX circuit 10F in the seventh embodiment, the two switching TFTs 12 share one boost circuit 20, but three or more switching TFTs 12 may share one boost circuit 20. With reference to FIG. 14, an active matrix substrate of the present embodiment will be described below. FIG. 14 is a view illustrating a configuration of a DEMUX circuit 10G included in the active matrix substrate of the present embodiment.

FIG. 14 shows three unit circuits 11A, 11B, and 11C (hereinafter respectively referred to as a "first unit circuit", a "second unit circuit", and a "third unit circuit") of a plurality of unit circuits 11 included in the DEMUX circuit 10G.

The first unit circuit 11A includes three branch lines BL1, BL4, and BL7 and three switching TFTs 12A, 12D, and 12G and distributes a display signal from a signal output line VL1 to source bus lines SL1, SL4, and SL7. The three switching TFTs (first switching TFT, second switching TFT, and third switching TFT) 12A, 12D, and 12G of the first unit circuit 11A are brought into the ON state at different timings during one horizontal scan period.

The second unit circuit 11B includes three branch lines BL2, BL5, and BL8 and three switching TFTs 12B 12E, and 12H and distributes a display signal from a signal output line VL2 to source bus lines SL2, SL5, and SL8. The three switching TFTs (first switching TFT, second switching TFT, and third switching TFT) 12B, 12E, and 12H of the second unit circuit 11B are brought into the ON state at different timings during one horizontal scan period.

The third unit circuit 11C includes three branch lines BL3, BL6, and BL9 and three switching TFTs 12C, 12F, and 12I and distributes a display signal from a signal output line VL3 to source bus lines SL3, SL6, and SL9. The three switching TFTs (first switching TFT, second switching TFT, and third switching TFT) 12C, 12F, and 12I of the third unit circuit 11C are brought into the ON state at different timings during one horizontal scan period.

Of three boost circuits 20A, 20B, and 20C shown in FIG. 14, the boost circuit 20A is commonly connected to the first switching TFT 12A of the first unit circuit 11A, the first switching TFT 12B of the second unit circuit 11B, and the first switching TFT 12C of the third unit circuit 11C. Moreover, the boost circuit 20B is commonly connected to the second switching TFT 12D of the first unit circuit 11A, the second switching TFT 12E of the second unit circuit 11B, and the second switching TFT 12F of the third unit circuit 11C. Furthermore, the boost circuit 20C is commonly connected to the third switching TFT 12G of the first unit circuit 11A, the third switching TFT 12H of the second unit circuit 11B, and the third switching TFT 12I of the third unit circuit 11C.

Thus, in the present embodiment, three switching TFTs 12 which are simultaneously selected share one boost circuit 20. This enables the number of circuit elements to further be reduced as compared to the seventh embodiment in which two switching TFTs 12 share one boost circuit 20. Thus, it is possible to further reduce consumed power, and further frame narrowing is possible.

The present embodiment has described an example in which the three switching TFTs 12 share one boost circuit 20, but four or more switching TFTs 12 may share one boost circuit 20.

Ninth Embodiment

Figure 15:
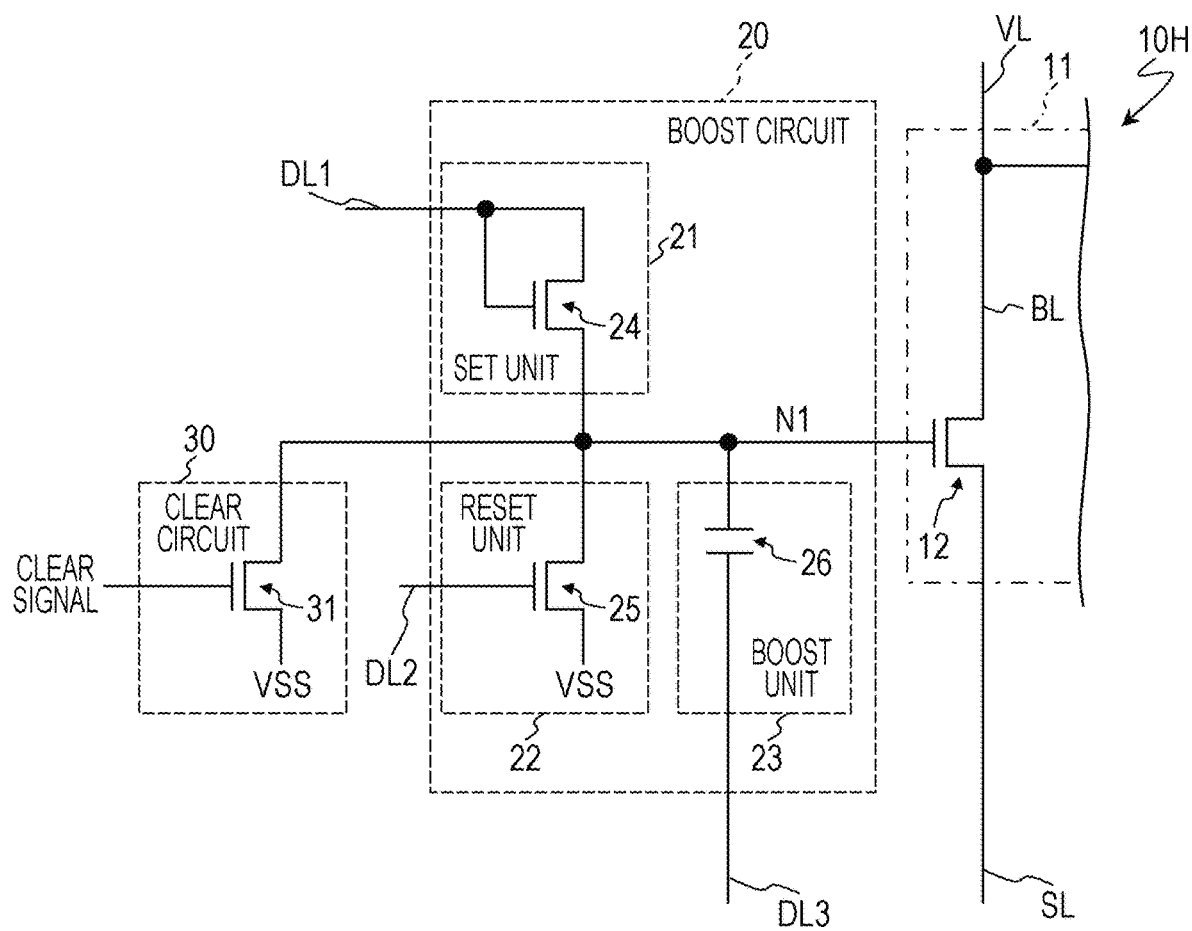
FIG. 15 is a view illustrating a configuration of a DEMUX circuit 10H included in an active matrix substrate of a ninth embodiment.

With reference to FIG. 15, an active matrix substrate of the present embodiment will be described. FIG. 15 is a view illustrating a configuration of a DEMUX circuit 10H included in the active matrix substrate of the present embodiment.

As illustrated in FIG. 15, the DEMUX circuit 10H further includes a plurality of clear circuits 30 each connected to a corresponding one of boost circuits 20 (in FIG. 15, one clear circuit 30 is shown). Each of the clear circuits 30 is configured to initialize a corresponding one of the boost circuits 20 at a prescribed timing.

In an example shown in FIG. 15, the clear circuit 30 includes a TFT (hereinafter referred to as a "clearing TFT") 31. The clearing TFT 31 has a gate electrode to which a clear signal is supplied. The clearing TFT 31 has a source electrode to which a constant potential (negative power supply potential VSS) is given, and the clearing TFT 31 has a drain electrode which is connected to a first node N1.

In the DEMUX circuit 10H including the clear circuits 30, when the clear signal supplied to the gate electrode of the clearing TFT 31 reaches a high level, the boost circuit 20 is initialized. Initialization of the boost circuit 20 by the clear circuit 30 is performed, for example, at the beginning or at the end of a drive period.

When the boost circuit 20 is initialized at the beginning of the drive period, the boost circuit 20 starts operating from an initialized state, and therefore, it is possible to reduce unexpected operation and/or unexpected output. Alternatively, initializing the boost circuit 20 at the end of the drive period enables charges (accumulated by drive) of each node to be discharged, and therefore, it is possible to prevent TFTs from being deteriorated due to charges remaining at the stop of the operation.

Tenth Embodiment

Figure 16:
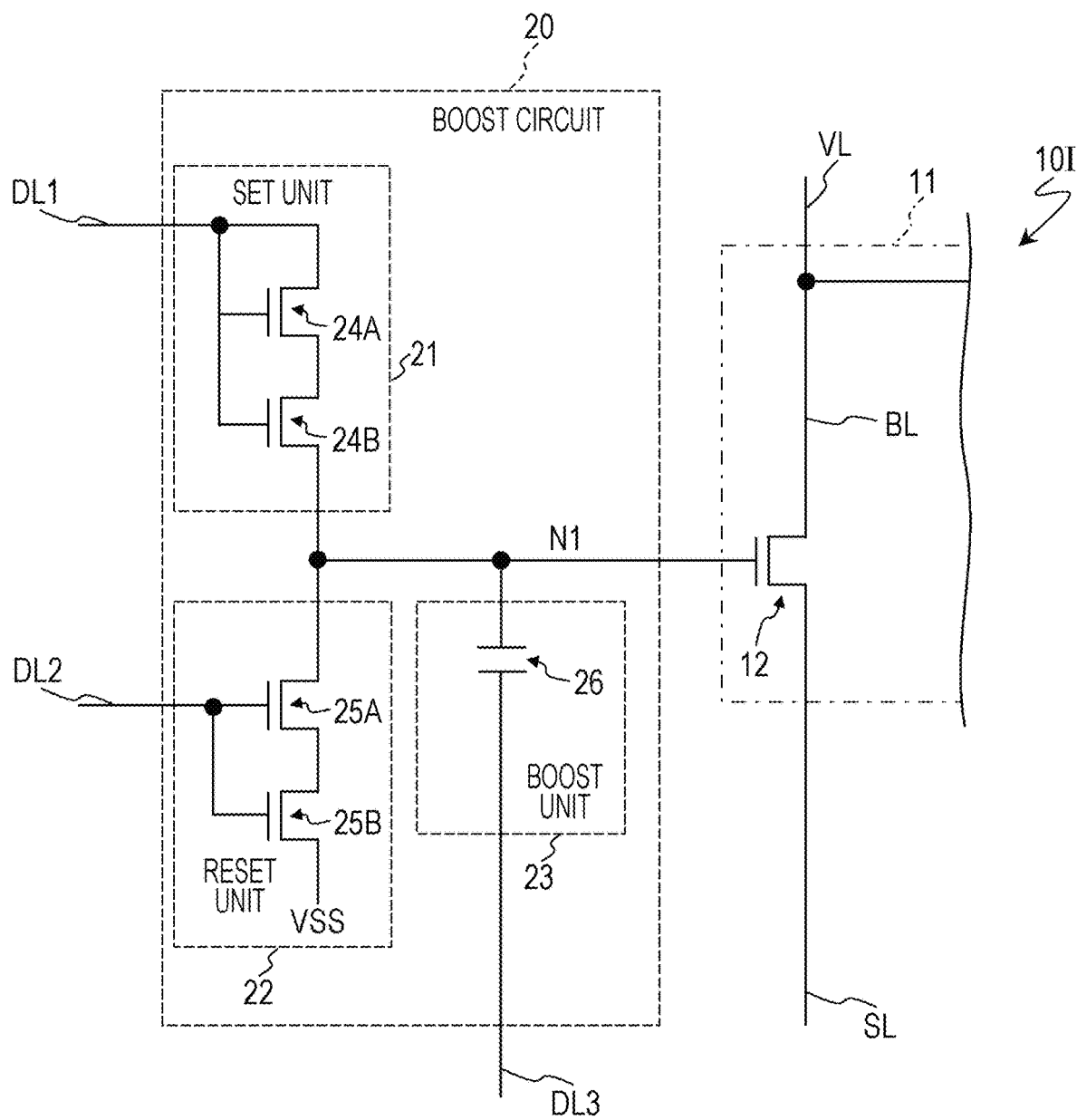
FIG. 16 is a view illustrating a configuration of a DEMUX circuit 10I included in an active matrix substrate of a tenth embodiment.

With reference to FIG. 16, an active matrix substrate of the present embodiment will be described. FIG. 16 is a view illustrating a configuration of a DEMUX circuit 10I included in the active matrix substrate of the present embodiment.

As illustrated in FIG. 16, the DEMUX circuit 10I includes a boost circuit 20 which includes a set unit 21 including a plurality of setting TFTs 24A and 24B which are connected to each other in series. The boost circuit 20 further includes a reset unit 22 including a plurality of resetting TFTs 25A and 25B which are connected to each other in series.

In the example shown in FIG. 16, the set unit 21 includes the two setting TFTs 24A and 24B (hereinafter respectively referred to as a "first setting TFT" and a "second setting TFT"). The first setting TFT 24A includes a gate electrode and a drain electrode which are connected to a first drive signal line DL1. That is, the first setting TFT 24A is diode-connected. The first setting TFT 24A includes a source electrode connected to a drain electrode of the second setting TFT 24B. The second setting TFT 24B has a gate electrode connected to the first drive signal line DL1, and the second setting TFT 24B has a source electrode connected to a first node N1.

Moreover, in the example shown in FIG. 16, the reset unit 22 includes the two resetting TFTs 25A and 25B (hereinafter respectively referred to as a "first resetting TFT" and a "second resetting TFT"). The first resetting TFT 25A includes a gate electrode connected to a second drive signal line DL2. The first resetting TFT 25A has a drain electrode connected to the first node N1, and the first resetting TFT 25A includes a source electrode connected to a drain electrode of the second resetting TFT 25B. The second resetting TFT 25B includes a gate electrode connected to the second drive signal line DL2. The second resetting TFT 25B includes a source electrode which receives a constant potential (negative power supply potential VSS).

As described above, the set unit 21 of the boost circuit 20 includes the plurality of setting TFTs 24A and 24B which are connected to each other in series, and the resetting unit 22 includes the plurality of resetting TFTs 25A and 25B which are connected to each other in series, and therefore, when the boost circuit 20 operates to boost the first node N1, it is possible to reduce (in the shown example, substantially halve) a potential difference given between the source and the drain of each TFT. That is, pressure proof can be improved.

Eleventh Embodiment

Figure 17:
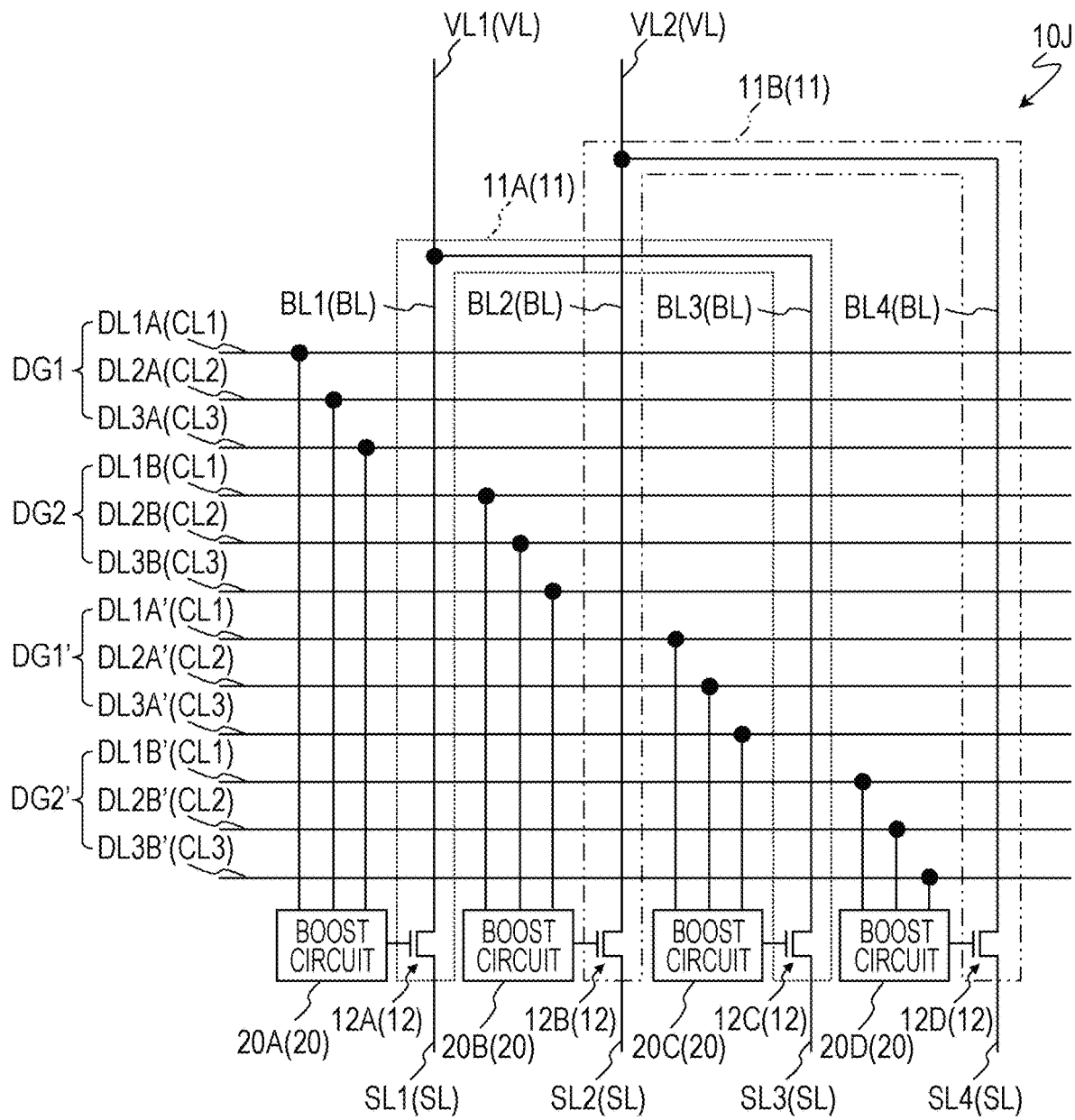
FIG. 17 is a view illustrating a configuration of a DEMUX circuit 10J included in an active matrix substrate of an eleventh embodiment.

With reference to FIG. 17, an active matrix substrate of the present embodiment will be described. FIG. 17 is a view illustrating a configuration of a DEMUX circuit 10J included in the active matrix substrate of the present embodiment.

The DEMUX circuit 10J shown in FIG. 17 is different from the DEMUX circuit 10 shown in FIG. 2 in that the DEMUX circuit 10J further includes drive signal line groups DG1' and DG2' in addition to the drive signal line groups DG1 and DG2.

Of four boost circuits 20 shown in FIG. 17, a boost circuit 20A is driven by the drive signal line group DG1, and a boost circuit 20B is driven by the drive signal line group DG2. Moreover, a boost circuit 20C is driven by the drive signal line group DG1', and a boost circuit 20D is driven by the drive signal line group DG2'.

In the DEMUX circuit 10 shown in FIG. 2, the boost circuit 20A and the boost circuit 20B which are driven at the same timing are driven by the same drive signal line group DG1. Moreover, the boost circuit 20C and the boost circuit 20D which are driven at the same timing are driven by the same drive signal line group DG2.

In contrast, in the DEMUX circuit 10J shown in FIG. 17, the boost circuit 20A and the boost circuit 20B which are driven at the same timing are respectively driven by drive signal line groups DG1 and DG2. Moreover, the boost circuit 20C and the boost circuit 20D which are driven at the same timing are respectively driven by drive signal line groups DG1' and DG2'.

To the drive signal line groups DG1 and DG1' is supplied a drive signal subjected to phase evolution, the drive signal being a signal for driving the boost circuits 20 at a timing. That is, the drive signal line groups DG1 and DG1' are different line groups which supply substantially the same signals.

To the drive signal line groups DG2 and DG2' is supplied a drive signal subjected to phase evolution, the drive signal being a signal for driving the boost circuits 20 at another timing. That is, the drive signal line groups DG2 and DG2' are different line groups which supply substantially the same signals.

As described above, the present embodiment includes: a line group via which a drive signal group for driving some boost circuits 20 of the two or more boost circuits 20 driven at the same timing is supplied; and another line group via which a drive signal group for driving some other of the two or more boost circuits 20 driven at the same timing is supplied. Since this enables the number of circuits connected to one drive signal line to be reduced, the load across each drive signal line is reduced, and it is possible to reduce a transition time (rising time and falling time) of the drive signal. Thus, it is possible to operate at an increased speed.

Twelfth Embodiment

With reference to FIGS. 18(a) and 18(b), an active matrix substrate of the present embodiment will be described. FIGS. 18(a) and 18(b) are views illustrating a configuration of a DEMUX circuit 10K included in the active matrix substrate of the present embodiment.

The DEMUX circuit 10K of the present embodiment is different from the DEMUX circuit 10H shown in FIG. 15 in that as illustrated in FIG. 18(b), a source electrode of a resetting TFT 25 and a source electrode of a clearing TFT 31 are connected to a first drive signal line DL1. When the configuration of the present embodiment is adopted, lines (VSS lines) for connecting the source electrode of the resetting TFT 25 and the source electrode of the clearing TFT 31 to a negative power supply are no longer necessary.

Figure 19:
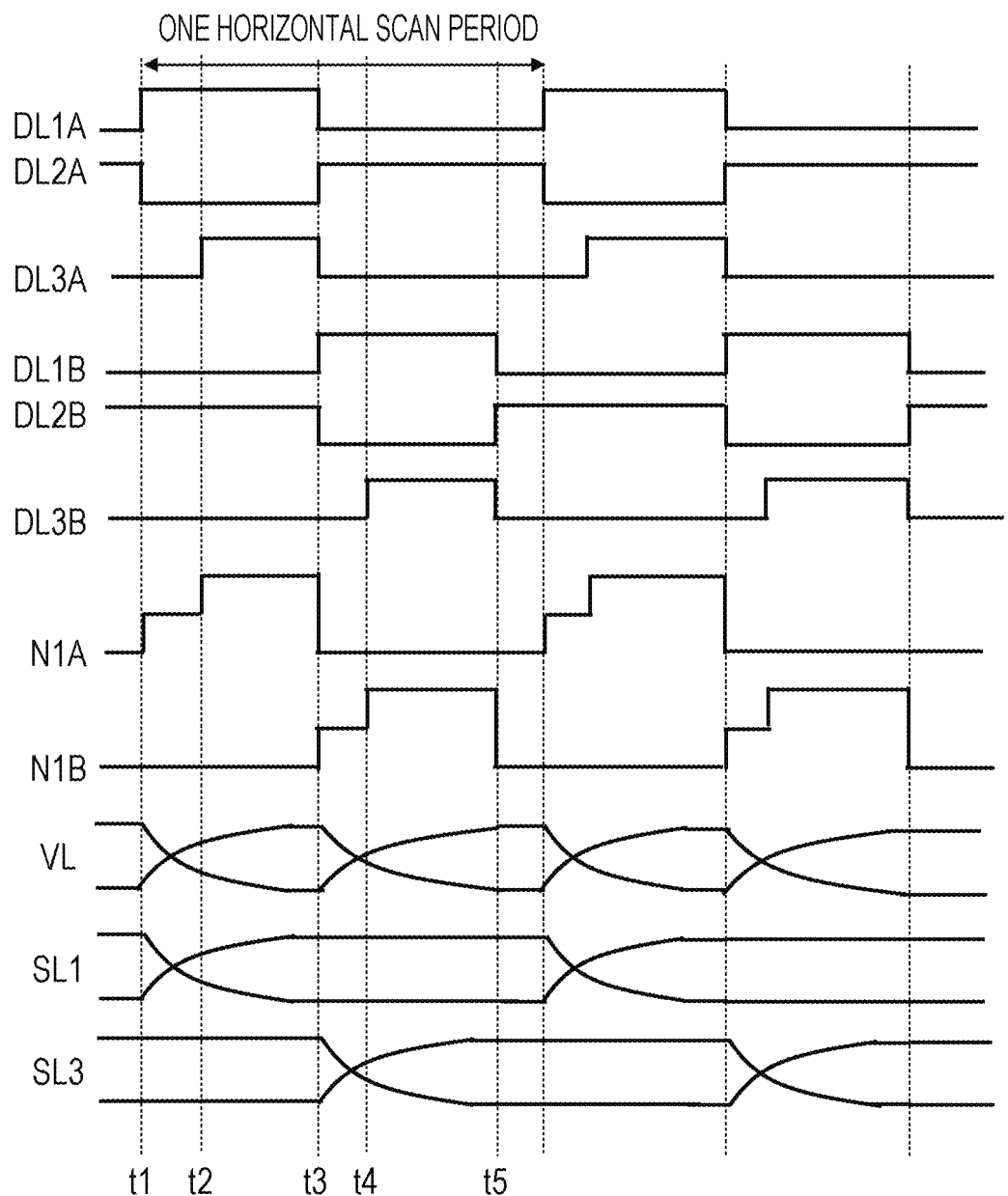
FIG. 19 is a timing diagram illustrating operation of the DEMUX circuit 10K.

Here, with reference to also FIG. 19, a description is given of a reason for that reset operation and clear operation can appropriately performed also when the source electrode of the resetting TFT 25 and the source electrode of the clearing TFT 31 are connected to the first drive signal line DL1. FIG. 19 is a timing diagram illustrating operation of the DEMUX circuit 10K.

In the first drive signal line DL1 and a second drive signal line DL2 for driving one boost circuit 20, as can be seen from FIG. 19, a signal supplied via the first drive signal line DL1 is a signal (inversion signal) in an inverted relationship with respect to a signal supplied via the second drive signal line DL2. Thus, when the potential of the second drive signal line DL2 is at a high level (i.e., a reset signal is input to the resetting TFT 25), the potential of the first drive signal line DL1 is at a low level. This enables the reset operation to be performed without problems. Moreover, when a timing at which the potential of the first drive signal line DL1 is at the low level is selected as a timing for performing the clear operation, it is possible to perform the clear operation without problems.

Note that the timing diagram shown in FIG. 19 is substantially the same as the timing diagram shown in FIG. 4. Therefore, for description of operation at each of times t1 to t5, see the description given with reference to the timing diagram in FIG. 4.

Moreover, in this embodiment, a configuration including the clear circuit 30 has been described, but in the DEMUX circuit 10 shown in FIG. 5, the DEMUX circuit 10A shown in FIG. 7, and the DEMUX circuit 10B shown in FIG. 9, connecting the source electrode of each of the resetting TFTs 25 and 28 to the first drive signal line DL1 enables similar effects to be obtained.

Thirteenth Embodiment

Figure 20:
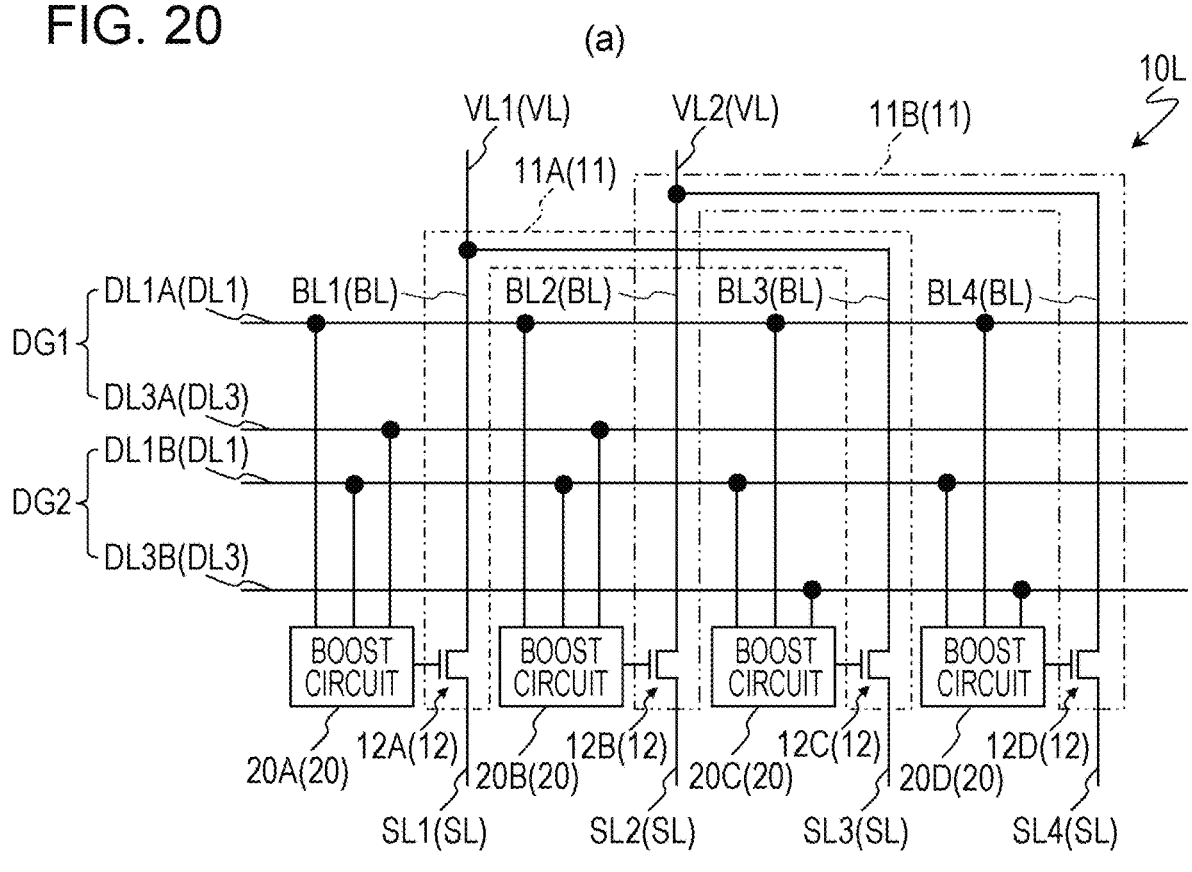
FIGS. 20(a) and 20(b) are views illustrating a configuration of a DEMUX circuit 10L included in an active matrix substrate of a thirteenth embodiment.
Figure 20:
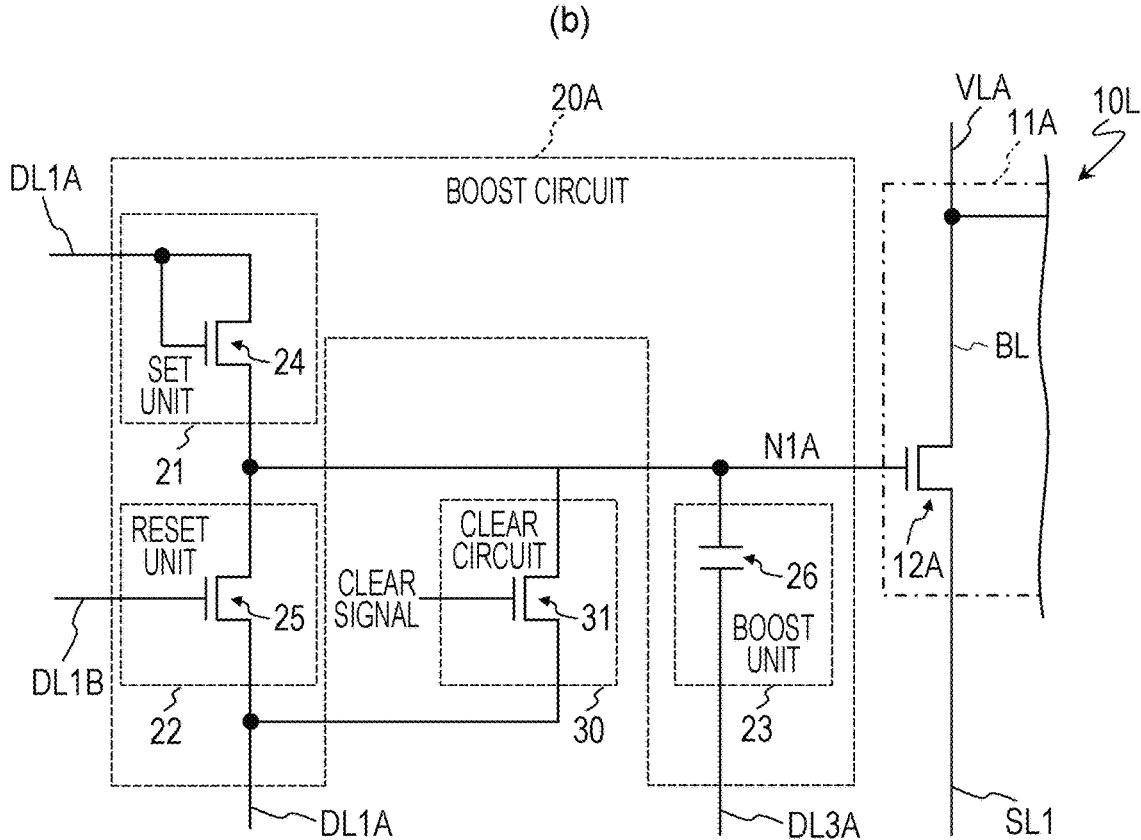

With reference to FIGS. 20(a) and 20(b), an active matrix substrate of the present embodiment will be described. FIGS. 20(a) and 20(b) are views illustrating a configuration of a DEMUX circuit 10L included in the active matrix substrate of the present embodiment.

Figure 18:
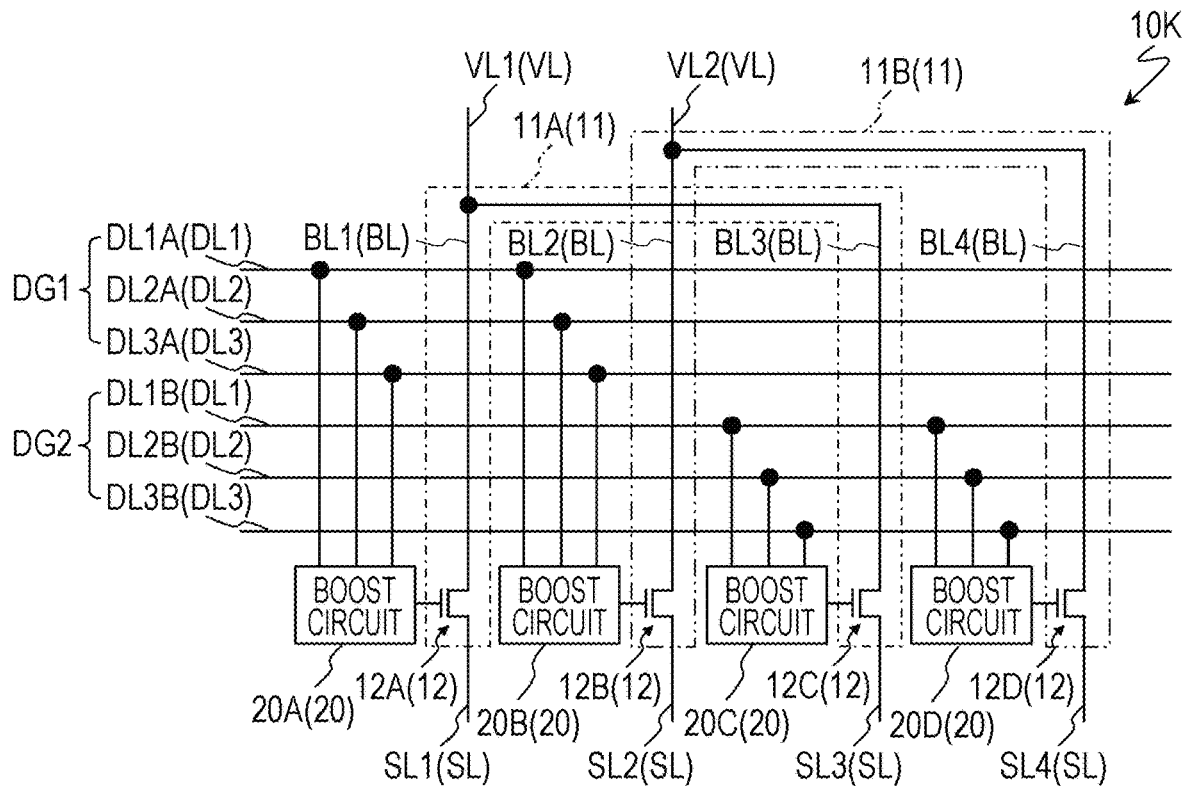
FIGS. 18(a) and 18(b) are views each illustrating a configuration of a DEMUX circuit 10K included in an active matrix substrate of a twelfth embodiment.
Figure 18:
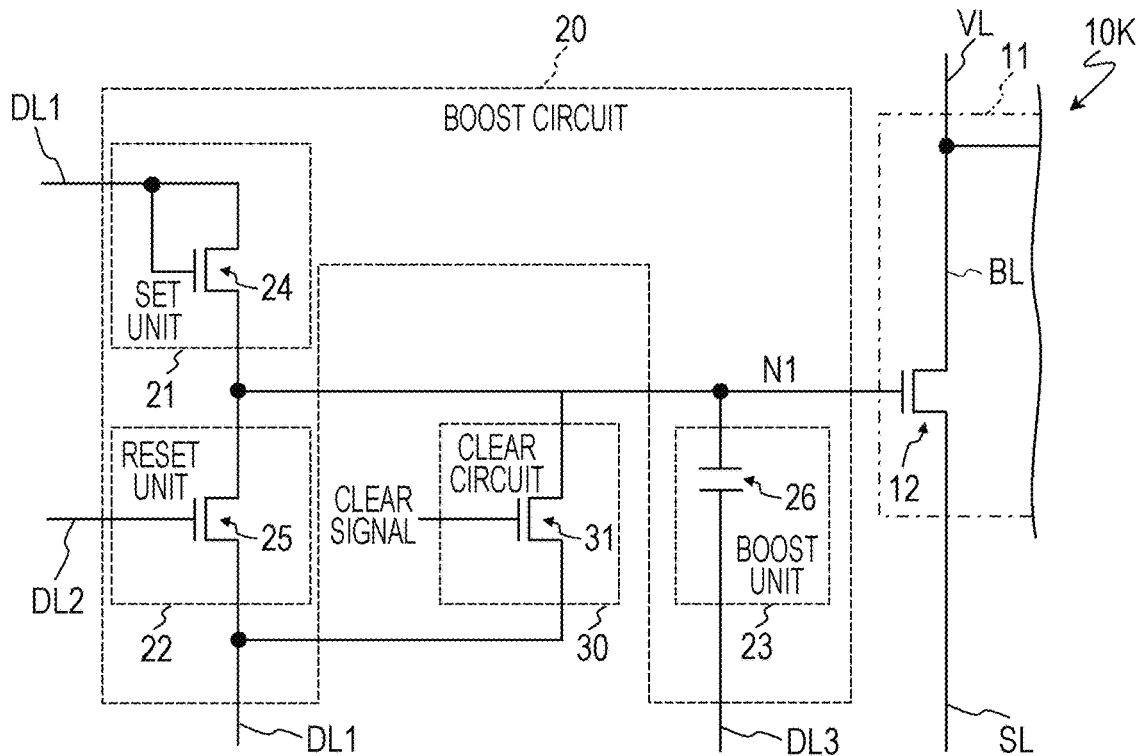

As illustrated in FIG. 20(a), the DEMUX circuit 10L of the present embodiment is different from the DEMUX circuit 10K shown in FIG. 18 in that the DEMUX circuit 10L does not include the second drive signal line DL2. FIG. 20(b) shows a boost circuit (first boost circuit) 20A connected to a unit circuit (first switching TFT) 12A of two switching TFTs 12A and 12C included in an unit circuit 11A of the DEMUX circuit 10L. As illustrated in FIG. 20(b), the first boost circuit 20A includes a resetting TFT 25 whose gate electrode is connected to a first drive signal line DL1B for a boost circuit (second boost circuit) 20C connected to the other switching TFT (second switching TFT) 12C. Moreover, although not shown here, the second boost circuit 20C includes a resetting TFT 25 whose gate electrode is connected to a first drive signal line DL1A for the first boost circuit 20A.

As described above, in the present embodiment, the first drive signal line DL1A for the first boost circuit 20A serves also as a second drive signal line for the second boost circuit 20C, and a first drive signal line DL1B for the second boost circuit 20C serves also as a second drive signal line for the first boost circuit 20A. When the configuration of the present embodiment is adopted, it is possible to omit the second drive signal line, thereby further reducing the number of lines.

Figure 21:
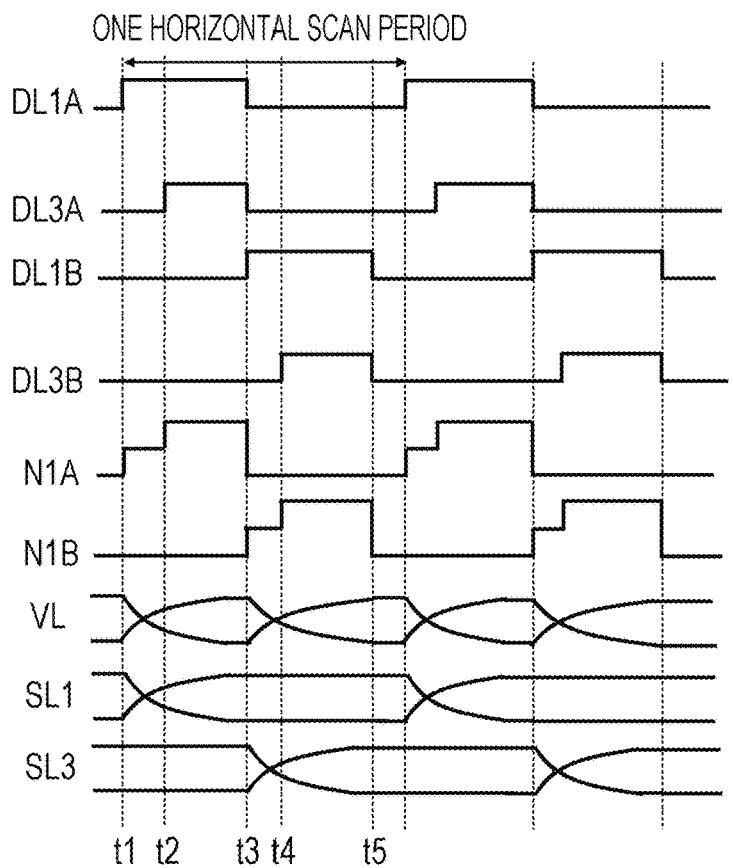
FIG. 21 is a timing diagram illustrating operation of the DEMUX circuit 10L.

Next, with reference to also FIG. 21, a description is given of a reason that a first drive signal line DL1 for a boost circuit 20 can serve also as a second drive signal line for another boost circuit 20. FIG. 21 is a timing diagram illustrating operation of the DEMUX circuit 10L.

As can be seen from FIG. 21, a signal supplied via the first drive signal line DL1A for the first boost circuit 20A is a signal in reverse phase to a signal supplied via the first drive signal line DL1B for the second boost circuit 20C. Thus, the first drive signal line DL1A for the first boost circuit 20A and the first drive signal line DL1B for the second boost circuit 20C are brought into a high level at different timings. Thus, a signal supplied via the first drive signal line DL1B for the second boost circuit 20C can be used as a reset signal for the first boost circuit 20A, and a signal supplied via the first drive signal line DL1A for the first boost circuit 20A can be used as a reset signal for the second boost circuit 20C.

Note that a configuration including a clear circuit 30 is described here, but also in the DEMUX circuit 10 shown in FIG. 5, the DEMUX circuit 10A shown in FIG. 7, and the DEMUX circuit 10B shown in FIG. 9, similar modification enables a similar effect to be obtained.

As to Oxide Semiconductor

An oxide semiconductor included in an oxide semiconductor layer of the switching TFT 12 may be an amorphous oxide semiconductor or may be a crystalline oxide semiconductor including a crystalline part. Examples of the crystalline oxide semiconductor include a polycrystalline oxide semiconductor, a microcrystalline oxide semiconductor, and a crystalline oxide semiconductor having a c-axis oriented substantially perpendicular to a layer surface.

The oxide semiconductor layer may have a layered structure including two or more layers. When the oxide semiconductor layer has the layered structure, the oxide semiconductor layer may include an amorphous oxide semiconductor layer and a crystalline oxide semiconductor layer, may include a plurality of crystalline oxide semiconductor layers having different crystal structures, or may include a plurality of amorphous oxide semiconductor layers. When the oxide semiconductor layer has a two-layer structure including an upper layer and a lower layer, the energy gap of an oxide semiconductor included in the upper layer is preferably larger than the energy gap of an oxide semiconductor included in the lower layer. Note that when the difference between the energy gaps of these layers is relatively small, the energy gap of the oxide semiconductor included in the lower layer may be larger than the energy gap of the oxide semiconductor included in the upper layer.

The material, the structure, the film formation method, of an amorphous oxide semiconductor and each crystalline oxide semiconductor described above, the configuration of an oxide semiconductor layer having a layered structure, and the like are described in, for example, Japanese Unexamined Patent Application Publication No. 2014-007399. For reference, the entire disclosure of Japanese Unexamined Patent Application Publication No. 2014-007399 is herein incorporated by reference.

The oxide semiconductor layer may include, for example, at least one metallic element of In, Ga, or Zn. In the embodiment of the present invention, the oxide semiconductor layer includes, for example, an In—Ga—Zn—O-based semiconductor (for example, Indium Gallium Zinc Oxide). Here, the In—Ga—Zn—O-based semiconductor is a ternary oxide of indium (In), gallium (Ga), and zinc (Zn), and the ratio (composition ratio) of In, Ga, and Zn is not particularly limited, and examples of the ratio include, for example, In:Ga:Zn=2:2:1, In:Ga:Zn=1:1:1, and In:Ga:Zn=1:1:2. The oxide semiconductor layer can be formed of an oxide semiconductor film including an In—Ga—Zn—O-based semiconductor.

The In—Ga—Zn—O-based semiconductor may be amorphous or crystalline. The crystalline In—Ga—Zn—O-based semiconductor is preferably a crystalline In—Ga—Zn—O-based semiconductor having the c-axis oriented substantially perpendicular to the layer surface.

Note that the crystal structure of the crystalline In—Ga—Zn—O-based semiconductor is disclosed in, for example, Japanese Unexamined Patent Application Publication No. 2014-007399 described above, Japanese Unexamined Patent Application Publication No. 2012-134475, and Japanese Unexamined Patent Application Publication No. 2014-209727. For reference, the entire disclosure of Japanese Unexamined Patent Application Publication No. 2012-134475 and Japanese Unexamined Patent Application Publication No. 2014-209727 is herein incorporated by reference. A TFT having an In—Ga—Zn-0-based semiconductor layer has high mobility (more than 20 times that of a-SiTFT) and a low leakage current (less than one hundredth that of a-SiTFT) and is thus appropriately used as the TFT switching TFT 12, and is alternatively used as a drive TFT (e.g., a TFT included in a drive circuit which is provided in the periphery of the display region including a plurality of pixels and which is provided on the same substrate as the display region) or a pixel TFT (TFT provided in a pixel).

The oxide semiconductor layer may include another oxide semiconductor instead of an In—Ga—Zn—O-based semiconductor. The oxide semiconductor layer may include, for example, In—Sn—Zn—O-based semiconductor (e.g., $In_2O_3$—$SnO_2$—ZnO; InSnZnO). The In—Sn—Zn—O-based semiconductor is a ternary oxide of indium (In), tin (Sn), and zinc (Zn). Alternatively, the oxide semiconductor layer may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, and the like.

Fourteenth Embodiment

Figure 22:
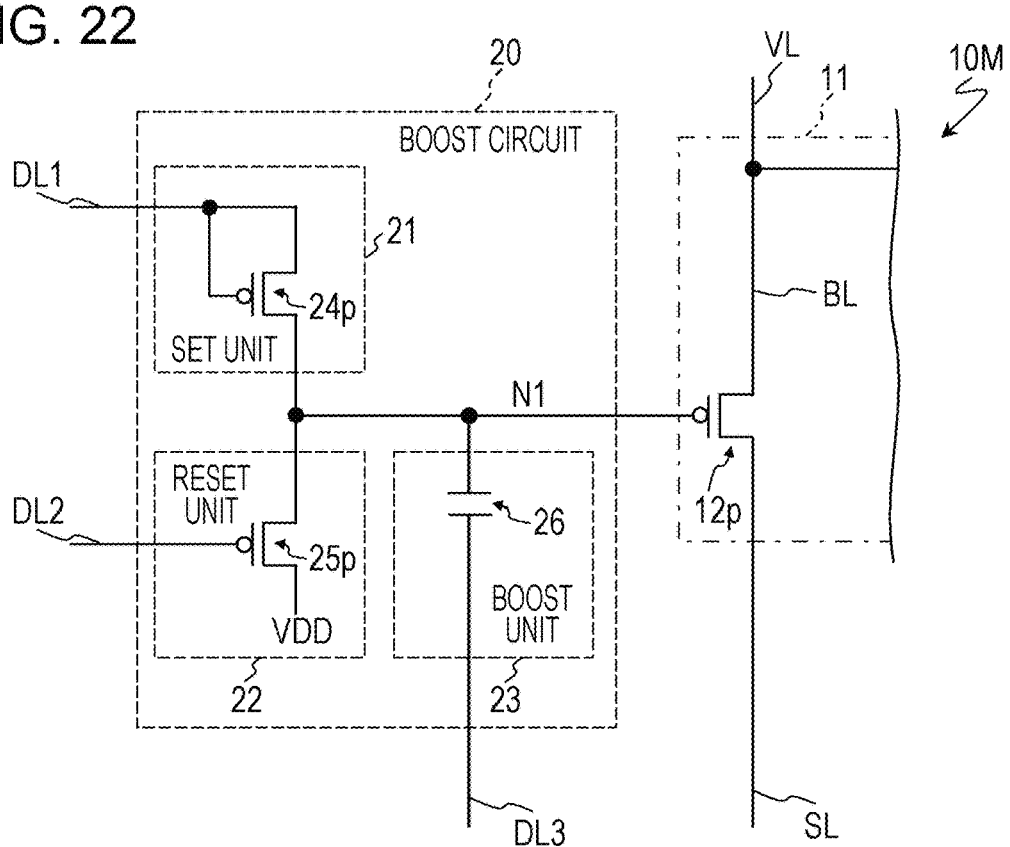
FIG. 22 is a view illustrating a configuration of a DEMUX circuit 10M included in an active matrix substrate of a fourteenth embodiment.
Figure 23:
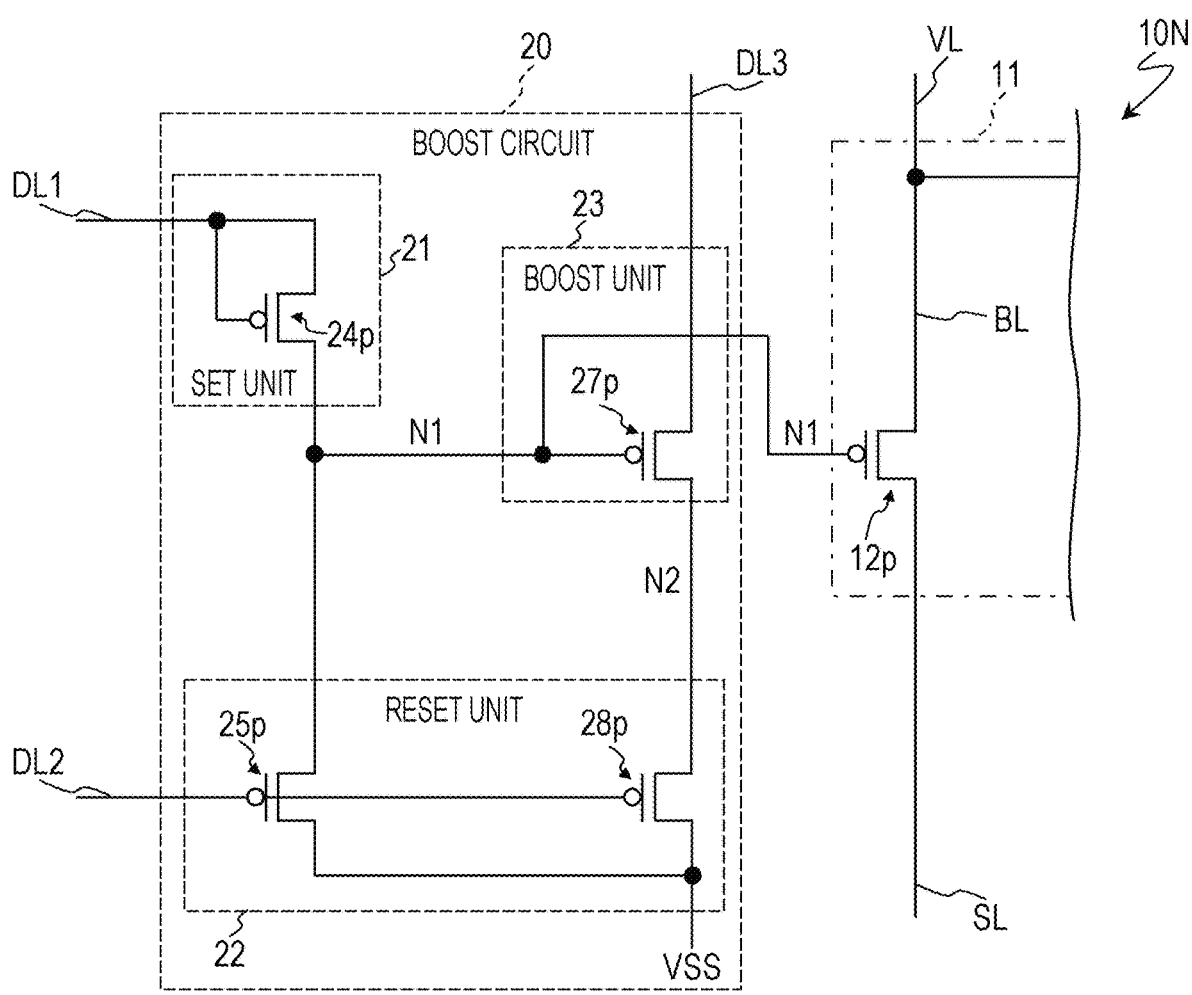
FIG. 23 is a view illustrating a configuration of a DEMUX circuit 10N included in another active matrix substrate of the fourteenth embodiment.

With reference to FIGS. 22 and 23, an active matrix substrate of the present embodiment will be described. FIG. 22 is a view illustrating a configuration of a DEMUX circuit 10M included in the active matrix substrate of the present embodiment. FIG. 23 is a view illustrating a configuration of a DEMUX circuit 10N included in the active matrix substrate of the present embodiment.

The DEMUX circuit 10M shown in FIG. 22 is different from the DEMUX circuit 10 of FIG. 5 in that a switching TFT 12p of each unit circuit 11 is a PMOS transistor including a polycrystalline silicon semiconductor layer (e.g., a low-temperature polysilicon (LTPS) layer) as an active layer. Moreover, in the DEMUX circuit 10M, other TFTs included in the circuit are PMOS transistors including polycrystalline silicon semiconductor layers. Thus, a setting TFT 24p of a set unit 21 and a resetting TFT 25p of a reset unit 22 are also PMOS transistors including polycrystalline silicon semiconductor layers.

The DEMUX circuit 10N shown in FIG. 23 is different from the DEMUX circuit 10A of FIG. 7 in that a switching TFT 12p of each unit circuit 11 is a PMOS transistor including a polycrystalline silicon semiconductor layer (e.g., a low-temperature polysilicon (LTPS) layer) as an active layer. Moreover, in the DEMUX circuit 10N, other TFTs included in the circuit are PMOS transistors including polycrystalline silicon semiconductor layers. Thus, the setting TFT 24p of the set unit 21, the resetting TFT 25p and a resetting TFT 28p of the reset unit 22, and a boosting TFT 27p of a boost unit 23 are also PMOS transistors including polycrystalline silicon semiconductor layers.

As the DEMUX circuits 10M and 10N respectively shown in FIGS. 22 and 23, also when the DEMUX circuit includes a PMOS transistor, timing and the like for driving are the same as those for the DEMUX circuit 10 shown in FIG. 2 and the DEMUX circuit 10A shown in FIG. 7 except for only that the polarity of a signal or the like is reversed (positive power supply potential VDD is given to a source electrode of the resetting TFT 25p).

As already described, the polycrystalline silicon has higher mobility than the oxide semiconductor, but the PMOS has lower mobility than the NMOS. Thus, as an active layer, when only the PMOS transistor including a polycrystalline silicon semiconductor layer is used as the DEMUX circuit TFT, the same problem as in the case of using an oxide semiconductor TFT occurs.

As in the present embodiment, when the DEMUX circuits 10M and 10N include boost circuits 20, a reduction of drive power and frame narrowing can be realized.

Drive Timing of DEMUX Circuit

An example in which a drive signal of a DEMUX circuit is toggled once in one horizontal scan period has been described, but the embodiment of the present invention is not limited to this example. For example, to reduce consumed power, the drive signal of the DEMUX circuit may be toggled once in two horizontal scan periods. More specific description is given below with reference to FIGS. 24(a) and 24 (b).

Figure 24:
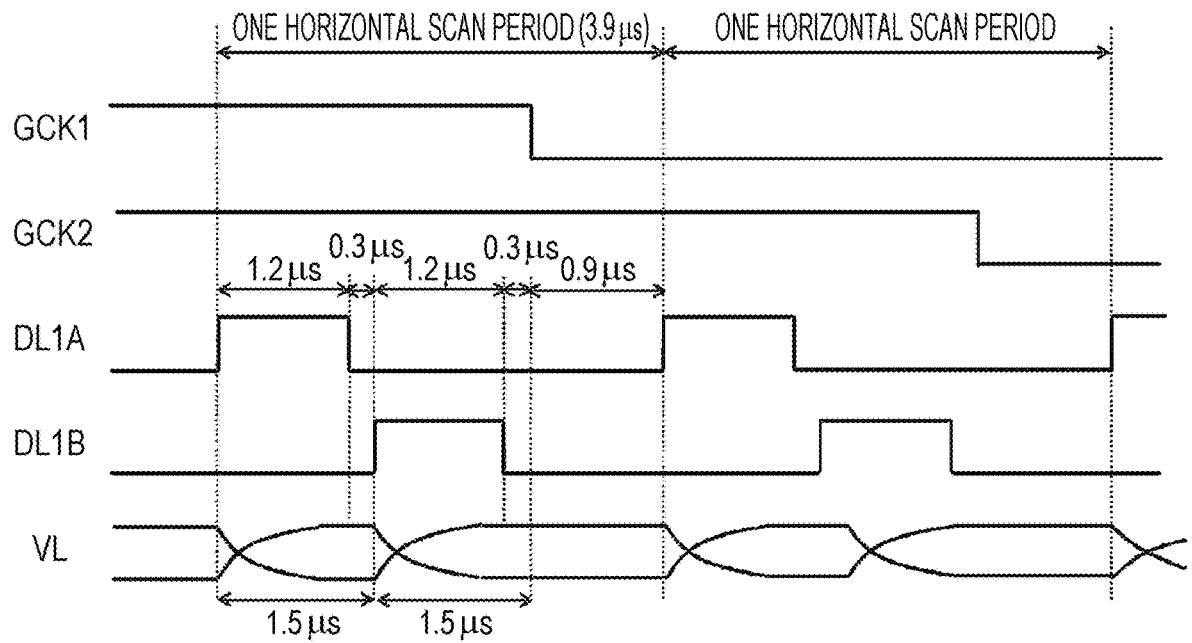
FIG. 24(a) is a timing diagram in a case where a drive signal of a DEMUX circuit is toggled once in one horizontal scan period.
FIG. 24(b) is a timing diagram in a case where the drive signal of the DEMUX circuit is toggled once in two horizontal scan periods.
Figure 24:
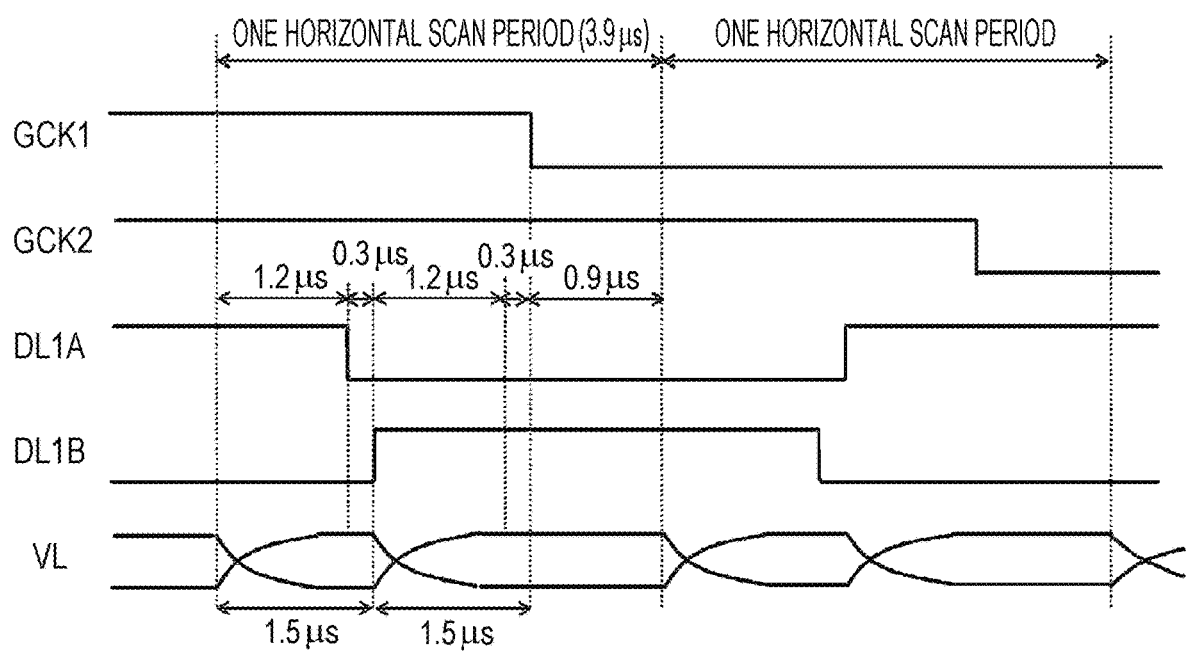

FIG. 24(a) is a timing diagram in a case where a drive signal is toggled once in one horizontal scan period, and FIG. 24(b) is a timing diagram in a case where the drive signal is toggled once in two horizontal scan periods. Each of FIGS. 24 (a) and 24(b) shows potentials of gate clock signals GCK1 and GCK2, potentials (potentials of first drive signals) of first drive signal lines DL1A and DL1B, and the potential of a signal output line VL.

In an example shown in FIG. 24(a), a drive signal is toggled once in one horizontal scan period. Source bus lines SL are selected in the order of source bus lines SL1, SL3, SL1, SL3 . . . .

In contrast, in an example shown in FIG. 24(b), a drive signal is toggled once in two horizontal scan periods. The source bus lines SL are selected in the order of source bus lines SL1, SL3, SL3, SL1, SL1 . . . . In the example shown in FIG. 24(b), the frequency of the drive signal is ½ of that in the example shown in FIG. 24(a), and therefore, it is possible to reduce consumed power (consumed power can be approximately halved).

Display Device

An active matrix substrate according to an embodiment of the present invention is appropriately adopted in display devices. Note that description has been given of an example of an active matrix substrate of a liquid crystal display device configured to perform display in a lateral electric field mode such as a FFS mode. However, the active matrix substrate of the present invention is applicable to an active matrix substrate of a liquid crystal display device configured to perform display in a vertical electric field mode (e.g., a TN mode and a vertical alignment mode) in which a voltage is applied in a thickness direction of the liquid crystal layer. An active matrix substrate according to an embodiment of the present invention is appropriately adopted also in display devices other than liquid crystal display devices (display devices including display medium layer other than a liquid crystal layer). For example, an active matrix substrate according to an embodiment of the present invention is adopted, for example, in electrophoretic display devices and organic electroluminescence (EL) display devices.

The liquid crystal display device may include an active matrix substrate, a counter substrate facing the active matrix substrate, and a liquid crystal layer disposed between the active matrix substrate and the counter substrate. The organic EL display device includes an active matrix substrate and an organic EL layer provided on the active matrix substrate.

INDUSTRIAL APPLICABILITY

According to the embodiment of the present invention, it is possible to reduce drive power of an active matrix substrate including a demultiplexer circuit. An active matrix substrate according to an embodiment of the present invention is appropriately adopted in various types of display devices.

REFERENCE SIGNS LIST

1 SUBSTRATE
2 THIN FILM TRANSISTOR (PIXEL TFT)
3 PIXEL ELECTRODE
4 COMMON ELECTRODE
5A, 5B GATE DRIVER
5a SHIFT REGISTER CIRCUIT
6 SOURCE DRIVER
10, 10A, 10B, 10C, 10D, 10E, 10F DEMULTIPLEXER CIRCUIT
10G, 10H, 10I, 10J, 10K, 10L DEMULTIPLEXER CIRCUIT
10M, 10N DEMULTIPLEXER CIRCUIT
11 UNIT CIRCUIT
12, 12p SWITCHING TFT
20 BOOST CIRCUIT
21 SET UNIT
22 RESET UNIT
23 BOOST UNIT
24, 24A, 24B, 24p SETTING TFT
25, 25A, 25B, 25p, 28, 28p RESETTING TFT
26, 29 BOOSTING CAPACITIVE ELEMENT
27, 27p BOOSTING TFT
27g GATE ELECTRODE OF BOOSTING TFT
27s SOURCE ELECTRODE OF BOOSTING TFT
27d DRAIN ELECTRODE OF BOOSTING TFT
30 CLEAR CIRCUIT
31 CLEARING TFT
100 ACTIVE MATRIX SUBSTRATE
GL GATE BUS LINE
SL GATE BUS LINE
VL SIGNAL OUTPUT LINE
DL1 FIRST DRIVE SIGNAL LINE
DL2 SECOND DRIVE SIGNAL LINE
DL3 THIRD DRIVE SIGNAL LINE
DG1, DG1', DG2, DG2', DG3 DRIVE SIGNAL LINE GROUP
N1 FIRST NODE

N2 SECOND NODE
DR DISPLAY REGION
FR PERIPHERAL REGION

The invention claimed is:

1. An active matrix substrate including a display region having a plurality of pixel regions and a peripheral region located in a periphery of the display region, the active matrix substrate comprising:
    a substrate;
    a plurality of gate bus lines and a plurality of source bus lines on the substrate;
    a source driver disposed in the peripheral region and including a plurality of output terminals;
    a plurality of signal output lines each connected to a corresponding one of the plurality of output terminals of the source driver; and
    a demultiplexer circuit which includes a plurality of unit circuits supported by the substrate and which is disposed in the peripheral region, wherein:
    each of the plurality of unit circuits of the demultiplexer circuit distributes a display signal from one signal output line of the plurality of signal output lines to n source bus lines of the plurality of source bus lines, where n is an integer larger than or equal to 2;
    each of the plurality of unit circuits includes
        n branch lines connected to the one signal output line, and
        n switching Thin Film Transistors (TFTs) each connected to a corresponding one of the n branch lines, the n switching TFTs being configured to perform individual on/off control of electrical connections of the n branch lines to the n source bus lines;
    the demultiplexer circuit further includes a plurality of boost circuits each configured to boost a voltage applied to a gate electrode of a corresponding one of the n switching TFTs,
    each of the plurality of boost circuits includes
        a set unit configured to pre-charge a first node connected to the gate electrode,
        a boost unit configured to boost a potential of the first node pre-charged by the set unit, and
        a reset unit configured to reset the potential of the first node;
    the demultiplexer circuit includes
        a first drive signal line via which a first drive signal is supplied to the set unit;
        a second drive signal line via which a second drive signal is supplied to the reset unit, and
        a third drive signal line via which a third drive signal is supplied to the boost unit;
    the set unit includes a setting TFT which includes a gate electrode connected to the first drive signal line and which is diode-connected,
    the reset unit includes a resetting TFT which includes a gate electrode connected to the second drive signal line and which is configured to pull down the potential of the first node, and
    the boost unit includes a boosting capacitive element including a first capacitance electrode connected to the third drive signal line and a second capacitance electrode connected to the first node;
    the setting TFT includes a source electrode and a drain electrode one of which is connected to the first drive signal line and the other of which is connected to the first node, and
    the resetting TFT includes a source electrode and a drain electrode one of which is connected to the first node and the other of which is connected to the first drive signal line.

2. The active matrix substrate according to claim 1, wherein
    the n switching TFTs included in each of the plurality of unit circuits include a first switching TFT and a second switching TFT which are brought into an ON state at different timings in one horizontal scan period,
    the plurality of boost circuits include a first boost circuit connected to the first switching TFT and a second boost circuit connected to the second switching TFT,
    the first drive signal line for the first boost circuit serves also as the second drive signal line for the second boost circuit, and
    the first drive signal line for the second boost circuit serves also as the second drive signal line for the first boost circuit.

3. The active matrix substrate according to claim 1, wherein
    each of the set unit and the reset unit includes a plurality of TFTs connected in series to each other.

4. The active matrix substrate according to claim 1, wherein
    the n switching TFTs included in each of the plurality of unit circuits are two switching TFTs, and
    the plurality of boost circuits each includes two boost circuits each of which is connected to a corresponding one of the two switching TFTs.

5. The active matrix substrate according to claim 1, wherein
    the n switching TFTs included in each of the plurality of unit circuits are two switching TFTs,
    the two switching TFTs are a first switching TFT and a second switching TFT which are brought into an ON state at different timings in one horizontal scan period, and
    the plurality of boost circuits include
        a first boost circuit commonly connected to the first switching TFTs of two unit circuits of the plurality of unit circuits and
        a second boost circuit commonly connected to the second switching TFTs of the two unit circuits.

6. The active matrix substrate according to claim 1, wherein
    the n switching TFTs included in each of the plurality of unit circuits are two switching TFTs,
    the two switching TFTs are a first switching TFT and a second switching TFT which are brought into an ON state at different timings in one horizontal scan period, and
    the plurality of boost circuits include
        a first boost circuit commonly connected to the first switching TFTs of three or more unit circuits of the plurality of unit circuits and
        a second boost circuit commonly connected to the second switching TFTs of the three or more unit circuits.

7. The active matrix substrate according to claim 1, wherein
    the n switching TFTs included in each of the plurality of unit circuits are three switching TFTs,
    each of the plurality of unit circuits include three boost circuits of the plurality of boost circuits, and
    each of the three boost circuits is connected to a corresponding one of the three switching TFTs.

8. The active matrix substrate according to claim 1, wherein
the n switching TFTs included in each of the plurality of unit circuits are three switching TFTs,
the three switching TFTs are a first switching TFT, a second switching TFT, and a third switching TFT which are brought into an ON state at different timings in one horizontal scan period, and
the plurality of boost circuits include
a first boost circuit commonly connected to the first switching TFTs of two unit circuits of the plurality of unit circuits,
a second boost circuit commonly connected to the second switching TFTs of the two unit circuit, and
a third boost circuit commonly connected to the third switching TFTs of the two unit circuits.

9. The active matrix substrate according to claim 1, wherein
the n switching TFTs included in each of the plurality of unit circuits are three switching TFTs,
the three switching TFTs are a first switching TFT, a second switching TFT, and a third switching TFT which are brought into an ON state at different timings in one horizontal scan period, and
the plurality of boost circuits include
a first boost circuit commonly connected to the first switching TFTs of three or more unit circuits of the plurality of unit circuits,
a second boost circuit commonly connected to the second switching TFTs of the three or more unit circuits, and
a third boost circuit commonly connected to the third switching TFTs of the three or more unit circuits.

10. The active matrix substrate according to claim 1, wherein
the demultiplexer circuit includes a plurality of clear circuits each connected to a corresponding one of the plurality of boost circuits and each configured to initialize the corresponding one of the plurality of boost circuits at a prescribed timing.

11. The active matrix substrate according to claim 10, wherein
each of the plurality of boost circuits includes
a set unit configured to pre-charge a first node connected to the gate electrode,
a boost unit configured to boost a potential of the first node pre-charged by the set unit, and
a reset unit configured to reset the potential of the first node;
the demultiplexer circuit includes
a first drive signal line via which a first drive signal is supplied to the set unit,
a second drive signal line via which a second drive signal is supplied to the reset unit, and
a third drive signal line via which a third drive signal is supplied to the boost unit; and
each of the plurality of clear circuits includes a clearing TFT including a gate electrode to which a clear signal is supplied, and a source electrode and a drain electrode one of which is connected to the first node and the other of which is connected to the first drive signal line.

12. The active matrix substrate according to claim 1, wherein
the plurality of boost circuits include two or more boost circuits which are driven at the same timing, and
the demultiplexer circuit includes
a first drive signal line group via which a drive signal group for driving some boost circuits of the two or more boost circuits is supplied and
a second drive signal line group via which a drive signal group for driving some other boost circuits of the two or more boost circuits is supplied, the second drive signal line group being different from the first drive signal line group.

13. The active matrix substrate according to claim 1, wherein
each of the n switching TFTs includes an oxide semiconductor layer as an active layer.

14. The active matrix substrate according to claim 1, wherein
each of the n switching TFTs is a PMOS transistor including a polycrystalline silicon semiconductor layer as an active layer.

15. A display device comprising:
the active matrix substrate according to claim 1.

16. An active matrix substrate including a display region having a plurality of pixel regions and a peripheral region located in a periphery of the display region, the active matrix substrate comprising:
a substrate;
a plurality of gate bus lines and a plurality of source bus lines on the substrate;
a source driver disposed in the peripheral region and including a plurality of output terminals;
a plurality of signal output lines each connected to a corresponding one of the plurality of output terminals of the source driver; and
a demultiplexer circuit which includes a plurality of unit circuits supported by the substrate and which is disposed in the peripheral region, wherein:
each of the plurality of unit circuits of the demultiplexer circuit distributes a display signal from one signal output line of the plurality of signal output lines to n source bus lines of the plurality of source bus lines, where n is an integer larger than or equal to 2;
each of the plurality of unit circuits includes
n branch lines connected to the one signal output line, and
n switching Thin Film Transistors (TFTs) each connected to a corresponding one of the n branch lines, the n switching TFTs being configured to perform individual on/off control of electrical connections of the n branch lines to the n source bus lines;
the demultiplexer circuit further includes a plurality of boost circuits each configured to boost a voltage applied to a gate electrode of a corresponding one of the n switching TFTs;
each of the plurality of boost circuits includes
a set unit configured to pre-charge a first node connected to the gate electrode,
a boost unit configured to boost a potential of the first node pre-charged by the set unit, and
a reset unit configured to reset the potential of the first node; and
each of the set unit and the reset unit includes a plurality of TFTs connected in series to each other.

17. An active matrix substrate including a display region having a plurality of pixel regions and a peripheral region located in a periphery of the display region, the active matrix substrate comprising:
a substrate;
a plurality of gate bus lines and a plurality of source bus lines on the substrate;

a source driver disposed in the peripheral region and including a plurality of output terminals;

a plurality of signal output lines each connected to a corresponding one of the plurality of output terminals of the source driver; and a demultiplexer circuit which includes a plurality of unit circuits supported by the substrate and which is disposed in the peripheral region, wherein:

each of the plurality of unit circuits of the demultiplexer circuit distributes a display signal from one signal output line of the plurality of signal output lines to n source bus lines of the plurality of source bus lines, where n is an integer larger than or equal to 2;

each of the plurality of unit circuits includes
- n branch lines connected to the one signal output line, and
- n switching Thin Film Transistors (TFTs) each connected to a corresponding one of the n branch lines, the n switching TFTs being configured to perform individual on/off control of electrical connections of the n branch lines to the n source bus lines;

the demultiplexer circuit further includes a plurality of boost circuits each configured to boost a voltage applied to a gate electrode of a corresponding one of the n switching TFTs; and the demultiplexer circuit includes a plurality of clear circuits each connected to a corresponding one of the plurality of boost circuits and each configured to initialize the corresponding one of the plurality of boost circuits at a prescribed timing.

* * * * *